United States Patent
Lee et al.

(10) Patent No.: US 12,414,340 B2
(45) Date of Patent: Sep. 9, 2025

(54) SEMICONDUCTOR STRUCTURE INCLUDING NANOSHEET CHANNEL STRUCTURE AND METHOD FOR FORMING THE SAME

(71) Applicant: TAIWAN SEMICONDUCTOR MANUFACTURING COMPANY LTD., Hsinchu (TW)

(72) Inventors: Hsin-Yi Lee, Hsinchu (TW); Weng Chang, Hsin-Chu (TW); Chi On Chui, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 10 days.

(21) Appl. No.: 17/388,465

(22) Filed: Jul. 29, 2021

(65) Prior Publication Data
US 2023/0034854 A1 Feb. 2, 2023

(51) Int. Cl.
*H10D 62/10* (2025.01)
*H10D 30/01* (2025.01)
*H10D 30/67* (2025.01)

(52) U.S. Cl.
CPC ......... *H10D 62/121* (2025.01); *H10D 30/031* (2025.01); *H10D 30/6735* (2025.01); *H10D 30/6757* (2025.01)

(58) Field of Classification Search
CPC .......... H01L 29/0673; H01L 29/42392; H01L 29/66742; H01L 29/78696; H10D 62/121; H10D 30/6757; H10D 30/6735; H10D 30/031
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |

(Continued)

*Primary Examiner* — Norman D Richards
*Assistant Examiner* — Sean Ayers Winters
(74) *Attorney, Agent, or Firm* — WPAT LAW; Anthony King

(57) ABSTRACT

The present disclosure provides a semiconductor structure and a method for forming the same. The semiconductor structure includes a first nanosheet channel structure and a first high-k dielectric layer surrounding the first nanosheet channel structure. In addition, the semiconductor structure includes a second nanosheet channel structure disposed above and substantially parallel to the first nanosheet channel structure, and a second high-k dielectric layer surrounding the second nanosheet channel structure. The semiconductor structure further includes a work function adjustment layer including silicon and disposed between the first high-k dielectric layer and the second high-k dielectric layer. The first high-k dielectric layer and the second high-k dielectric layer are separated by the work function adjustment layer.

20 Claims, 29 Drawing Sheets

(56) References Cited

U.S. PATENT DOCUMENTS

| | | | |
|---|---|---|---|
| 2005/0006703 A1* | 1/2005 | Miscione | H01L 27/12 |
| | | | 438/149 |
| 2015/0187892 A1* | 7/2015 | Yin | H01L 29/7846 |
| | | | 438/296 |
| 2016/0181107 A1* | 6/2016 | Shin | H01L 21/28132 |
| | | | 438/592 |
| 2016/0315088 A1* | 10/2016 | Kang | H01L 29/513 |
| 2019/0081152 A1* | 3/2019 | Suh | H01L 29/66545 |
| 2019/0348541 A1* | 11/2019 | Moroz | H01L 21/30604 |
| 2019/0378906 A1* | 12/2019 | Loubet | H01L 29/66742 |
| 2020/0035567 A1* | 1/2020 | Chanemougame | H01L 29/401 |
| 2020/0075720 A1* | 3/2020 | Cheng | H01L 29/78696 |
| 2020/0098756 A1* | 3/2020 | Lilak | H10D 62/83 |
| 2020/0111885 A1* | 4/2020 | Lin | H01L 29/66568 |
| 2020/0152746 A1* | 5/2020 | Tsau | H01L 23/53266 |
| 2021/0098589 A1* | 4/2021 | Cheng | H01L 21/823412 |
| 2021/0217654 A1* | 7/2021 | Xie | H01L 21/22 |

\* cited by examiner

SEMICONDUCTOR STRUCTURE INCLUDING NANOSHEET CHANNEL STRUCTURE AND METHOD FOR FORMING THE SAME

BACKGROUND

The electronics industry has experienced an ever increasing demand for smaller and faster electronic devices which are able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, gate-all around transistors (GAA) have been developed. In some examples, a gate structure of a GAA transistor is disposed around a channel region providing access to the channel on multiple sides. GAA transistors are compatible with complementary metal-oxide-semiconductor (CMOS) processes and their structure allows them to be aggressively scaled while maintaining gate control.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
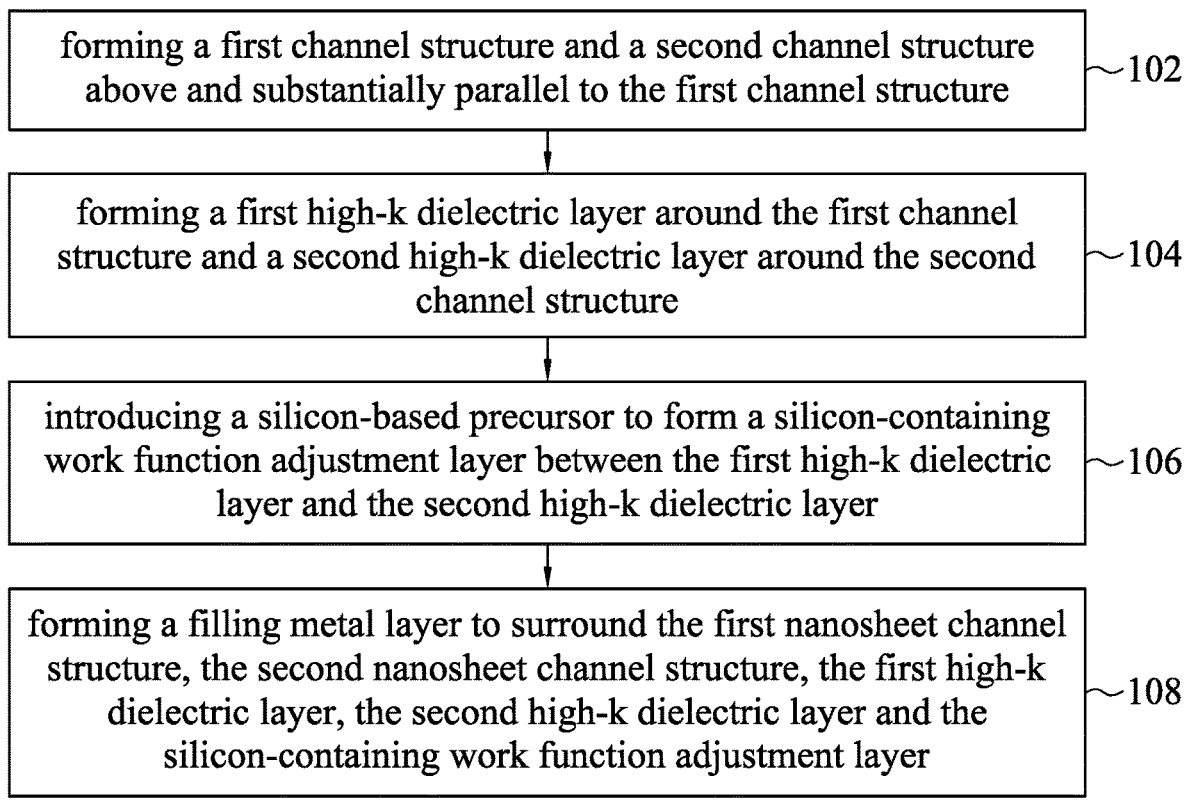
FIG. 1 shows a flow chart illustrating a method for forming a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence, order, or importance unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally means within a value or range (e.g., within 10%, 5%, 1%, or 0.5% of a given value or range) that can be contemplated by people having ordinary skill in the art. Alternatively, the term "substantially," "approximately" or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

In one comparative embodiment, a semiconductor structure associated with an n-type transistor includes a work function adjustment layer (WFA layer), in which the WFA layer includes an aluminum (Al)-containing material such as TiAl, TiAlC, TiAlN, TaAl or TaAlC. The Al-containing WFA layer needs to have a relatively large thickness (e.g., more than 25 Angstrom) to achieve a desired band-edge work function (e.g., approximately 4.2 eV), which hinders the semiconductor structure from further shrinkage in size.

Some embodiments of the present disclosure therefore provide a semiconductor structure that includes a WFA layer containing silicon (Si) element and a method for forming the semiconductor structure. The WFA layer contains Si element, instead of Al element. Therefore, the WFA layer in accordance with some embodiments of the present disclosure can have a relatively small thickness to achieve the desired band-edge work function. For example, a thickness of the Si-containing WFA layer may be half of a thickness of the Al-containing WFA layer, thereby facilitating downscaling of a semiconductor device, such as a transistor.

FIG. 1 shows a flow chart illustrating a method 10 for forming a semiconductor structure in accordance with some embodiments of the present disclosure. The method 10 includes an operation 102, in which a first channel structure and a second channel structure are formed. The second channel structure is disposed above and substantially parallel to the first channel structure. The method 10 also includes an operation 104, in which a first high-k dielectric layer is formed around the first channel structure and a second high-k dielectric layer is formed around the second channel structure. The method 10 further includes an operation 106, in which a silicon-based precursor is introduced to form a silicon-containing work function adjustment layer between the first high-k dielectric layer and the second high-k dielectric layer. The method 10 further includes an operation 108, in which a filling metal layer is formed to surround the first nanosheet channel structure, the second nanosheet channel structure, the first high-k dielectric layer, the second high-k dielectric layer and the silicon-containing work function adjustment layer. In some embodiments, the silicon-containing work function adjustment layer includes an hourglass shape around the first high-k dielectric layer and the second high-k dielectric layer. In some embodiments, the method 10 further includes oxidizing the silicon-containing work function adjustment layer prior to forming the filling metal layer.

Although this method and other methods illustrated and/or described hereinafter are illustrated as a series of acts or events, it will be appreciated that the present disclosure is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

FIGS. 2 to 13, 14A, 15A, 16A, and 17A illustrate perspective views of a semiconductor structure at various fabrication stages in accordance with some embodiments of the present disclosure. FIGS. 14B, 15B, 16B, and 17B illustrate cross-sectional views of a semiconductor structure taken along line B-B of FIGS. 14A, 15A, 16A, and 17A, respectively, in accordance with some embodiments of the present disclosure. FIGS. 14C, 15C, 16C, and 17C illustrate cross-sectional views of a semiconductor structure taken along line C-C of FIGS. 14A, 15A, 16A, and 17A, respectively, in accordance with some embodiments of the present disclosure.

Figure 2:
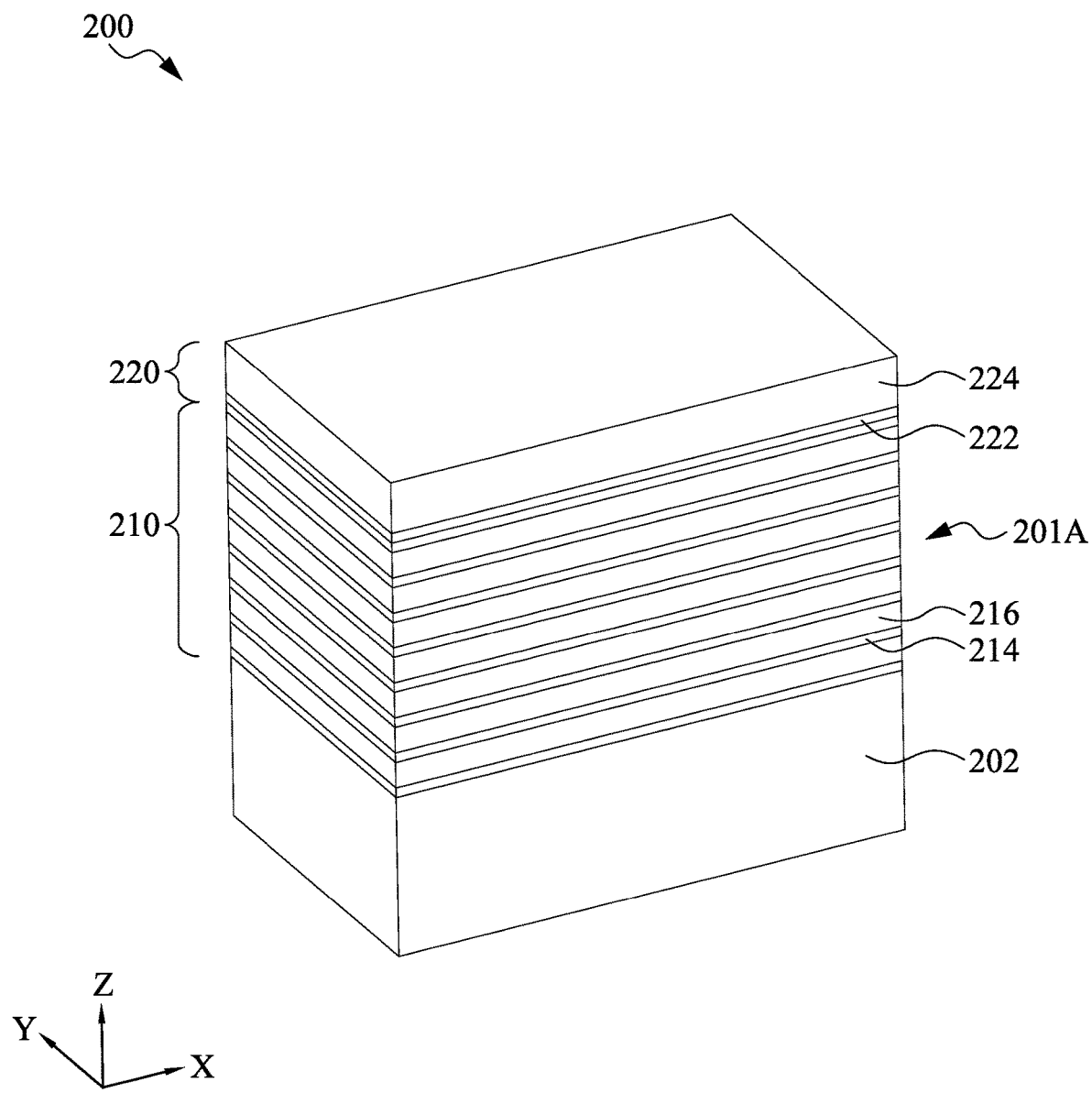
FIGS. 2 to 13, 14A, 15A, 16A, and 17A illustrate perspective views of a semiconductor structure at various fabrication stages in accordance with some embodiments of the present disclosure.

Referring to FIG. 2, an epitaxial stack 210 is formed over a substrate 202 of a semiconductor structure 200. The epitaxial stack 210 includes first epitaxial layers 214 of a first composition interposed by second epitaxial layers 216 of a second composition. In some embodiments, the first composition and the second composition are different. For example, the first epitaxial layers 214 may be formed of silicon germanium (SiGe) and the second epitaxial layers 216 may be formed of silicon (Si).

The substrate 202 can be any suitable substrate, and can be processed with various features. In some embodiments, the substrate 202 is a semiconductor substrate, such as a silicon substrate. In another embodiment, the substrate 202 includes various layers, including conductive or insulating layers formed on a semiconductor substrate. In some embodiments, the substrate 202 includes various doping configurations depending on design requirements. For example, different doping profiles (e.g., n wells, p wells) may be formed on the substrate 202 in regions designed for different transistor types, such as an n-type FET (NFET), a p-type FET (PFET), and the like. The doping profiles can be formed using any suitable process, such as ion implantation of dopants and/or diffusion processes. In some embodiments, the substrate 202 may have isolation structures, such as shallow trench isolations (STIs), and the like interposing respective regions providing different transistor types. In some embodiments, the substrate 202 is formed of any suitable semiconductor material, such as germanium, silicon carbide (SiC), SiGe, diamond, a compound semiconductor, an alloy semiconductor, and the like. In some embodiments, the substrate 202 includes an epitaxial layer formed on insulator.

It is noted that seven (7) layers of the first epitaxial layers 214 and six (6) layers of the second epitaxial layers 216 are illustrated in FIG. 2 merely for illustrative purposes, and the scope of the present disclosure is not limited thereto. Any suitable number of epitaxial layers can be formed in the epitaxial stack 210. The number of epitaxy layers depends on a desired number of channel structures for respective transistors. In some embodiments, the number of second epitaxial layers 216 is between 2 and 10, for example, to form a stack of 2 to 10 channel structures.

In some embodiments, each of the first epitaxial layers 214 has a thickness range of about 2 nanometers (nm) to about 10 nm. For example, each of the first epitaxial layers 214 has a thickness range of about 4 nm to about 10 nm. In some embodiments, each of the first epitaxial layers 214 has a relatively uniform thickness. The first epitaxial layers 214 can have same thickness or different thicknesses. In some embodiments, each of the second epitaxial layers 216 has a thickness range of about 5 nm to about 12 nm. In some embodiments, each of the second epitaxial layers 216 is substantially uniform in thickness. The second epitaxial layers 216 can have same thickness or different thicknesses. In some embodiments, the second epitaxial layers 216 are thicker than the first epitaxial layers 214. As described in more detail below, in some examples, channel structures of a transistor are respectively formed using the second epitaxial layers 216. In some embodiments, the thickness of the second epitaxial layers 216 is chosen based on, for example, manufacturing considerations, transistor performance considerations, and the like. In some embodiments, the thickness of the first epitaxial layers 214 are used to define a space between adjacent channel structures, and the respective thickness of the first epitaxial layers 214 is chosen based on, for example, manufacturing considerations, transistor performance considerations, and the like.

By way of example, forming the epitaxial stack 210 may be performed by a molecular beam epitaxy (MBE) process, a metal organic chemical vapor deposition (MOCVD) process, and/or other suitable epitaxial growth processes. In some embodiments, the epitaxially grown layers, such as the second epitaxial layers 216, include the same material as the substrate 202. In some embodiments, the first and second epitaxial layers, 214 and 216, include a different material than the substrate 202. As described above, in some examples, the first epitaxial layer 214 includes an epitaxially grown SiGe layer and the second epitaxial layer 216 includes epitaxially grown Si layer. In some alternative embodiments, either of the first and second epitaxial layers, 214 and 216, include other materials such as germanium, a compound semiconductor such as SiC, gallium arsenide, gallium phosphide, indium phosphide, indium arsenide, and/or indium antimonide, an alloy semiconductor such as SiGe, GaAsP, AlInAs, AlGaAs, InGaAs, GaNP, and/or GaInAsP, or combinations thereof. As described above, the materials of the first and second epitaxial layers, 214 and 216, may be chosen based on providing differing etch selectivity properties. In various embodiments, the first and second epitaxial layers, 214 and 216, are substantially dopant-free (i.e., having an extrinsic dopant concentration less than about $1 \times 10^7$ cm$^{-3}$). For example, no intentional doping is performed during the epitaxial growth process.

As also shown in the example of FIG. 2, a hard mask (HM) layer 220 may be formed over the epitaxial stack 210. In some embodiments, the HM layer 220 includes an oxide layer 222 (e.g., a pad oxide layer of SiO$_2$) and nitride layer 224 (e.g., a pad nitride layer of Si$_3$N$_4$) formed over the oxide layer 222. In some embodiments, the oxide layer 222 includes thermally grown oxide, chemical vapor deposition (CVD) deposited oxide, and/or atomic layer deposition (ALD) deposited oxide. In some embodiments, the nitride layer 224 includes a nitride layer deposited by CVD or other suitable technique. The HM layer 220 is used to protect portions of the substrate 202 and/or the epitaxial stack 210 and/or is used to define a pattern (e.g., fin elements) as described below.

Figure 3:
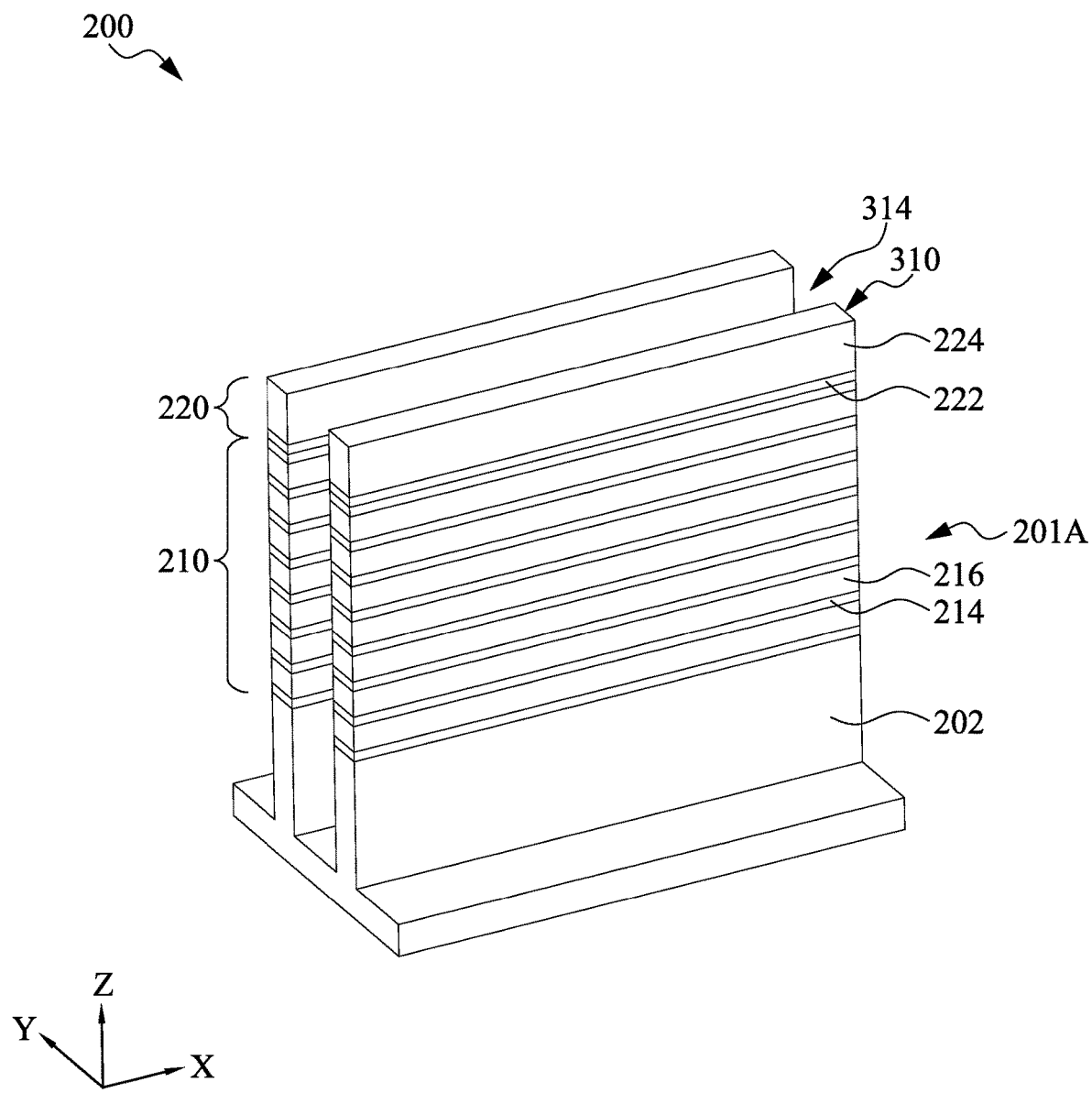

Referring to FIG. 3, a plurality of fin elements 310 (referred to as fins) are formed. The plurality of fin elements 310 protrude from the substrate 202. In various embodiments, each of the fins 310 includes a portion formed from the substrate 202, a portion of the epitaxial stack 210, and a portion of the HM layer 220. The portion of the epitaxial stack 210 includes portions of the first epitaxial layers 214 and the second epitaxial layers 216.

In some embodiments, the fins 310 are fabricated using suitable processes including photolithography and etch processes. During a photolithography process, in an example, a photoresist layer is formed (e.g., spun) over the surface of the semiconductor structure 200, for example, over the HM layer 220 of FIG. 2. Subsequently, the photoresist layer is exposed according to a mask of patterns, and is developed to form the patterns in the photoresist layer. The photoresist layer with the patterns can be used as a masking element to pattern other layers. In some embodiments, patterning the photoresist layer to form the masking element is performed using an electron beam (e-beam) lithography process. The masking element is then used to protect regions of the substrate 202, and layers formed thereupon, while an etch process forms trenches 314 in unprotected regions through the HM layer 220, through the epitaxial stack 210, and into the substrate 202, thereby leaving the fins 310. In some examples, the trenches 314 is formed using a dry etch (e.g., reactive ion etching), a wet etch, and/or combination thereof.

Numerous other embodiments of methods to form fins on a substrate can also be used. In an example, a method to form fins can include defining a fin region (e.g., by mask or isolation regions) and epitaxially growing the epitaxial stack 210 in the form of the fins 310. In some embodiments, forming the fins 310 includes a trim process to decrease widths of the fins 310. The trim process includes wet and/or dry etching processes.

Figure 4:
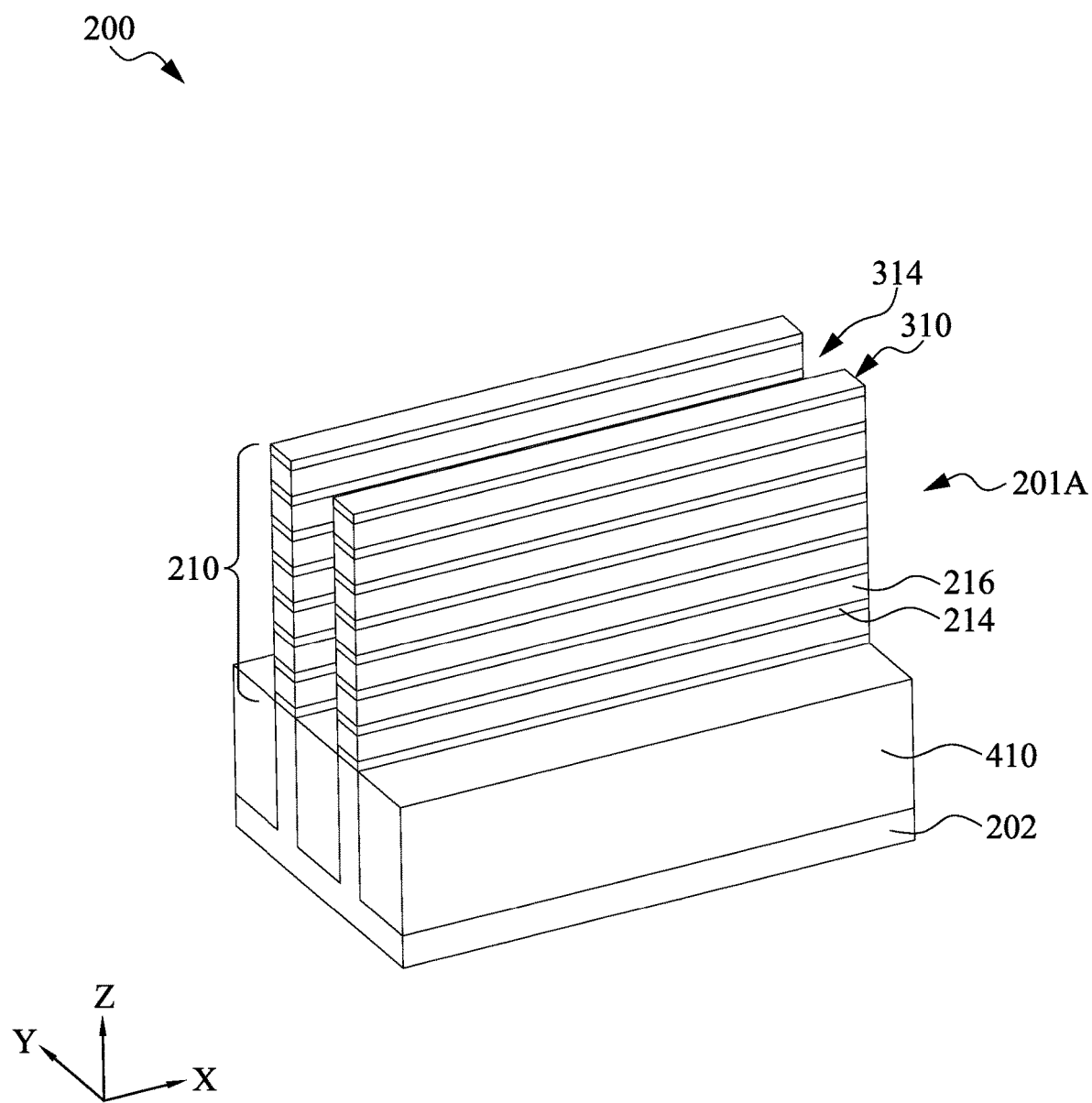

Referring to FIG. 4, isolation structures, such as STIs, are formed between the fins 310. By way of example, in some embodiments, a dielectric layer of dielectric materials is first deposited over the substrate 202, filling the trenches 314 with the dielectric material. In some embodiments, the dielectric layer may include SiO$_2$, silicon nitride, silicon oxynitride, fluorine doped silicate glass (FSG), a low dielectric constant (low-k dielectric) material, a combination thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. In some embodiments, after deposition of the dielectric layer, the semiconductor structure 200 is annealed, for example, to improve quality of the dielectric layer. In some embodiments, the dielectric layer (and the subsequently formed STIs) includes a multi-layer structure, for example, having one or more liner layers.

In an example to form the STIs, after deposition of the dielectric layer, the dielectric material is thinned and planarized, for example, by a chemical mechanical polishing (CMP) process. The CMP process planarizes the top surface of the dielectric layer. In some embodiments, the CMP process also removes the HM layer 220 from each of the fins 310. In some embodiments, removal of the HM layer 220 is performed by using a suitable etching process (e.g., a dry or a wet etching process). In some embodiment, after the planarization, the dielectric layer is recesses to form the STIs interposing the fins 310 so that the fins 310 extend above the recessed STIs 410. In some embodiments, the recessing process includes a dry etching process, a wet etching process, and/or a combination thereof. In some embodiments, a recessing depth is controlled (e.g., by controlling an etching time) so as to result in a desired height of the exposed upper portion of the fins 310, referred to as upper fins 310A. In some embodiments, the height exposes each of the first and second epitaxy layers 214 and 216 of the epitaxial stack 210.

Figure 5:
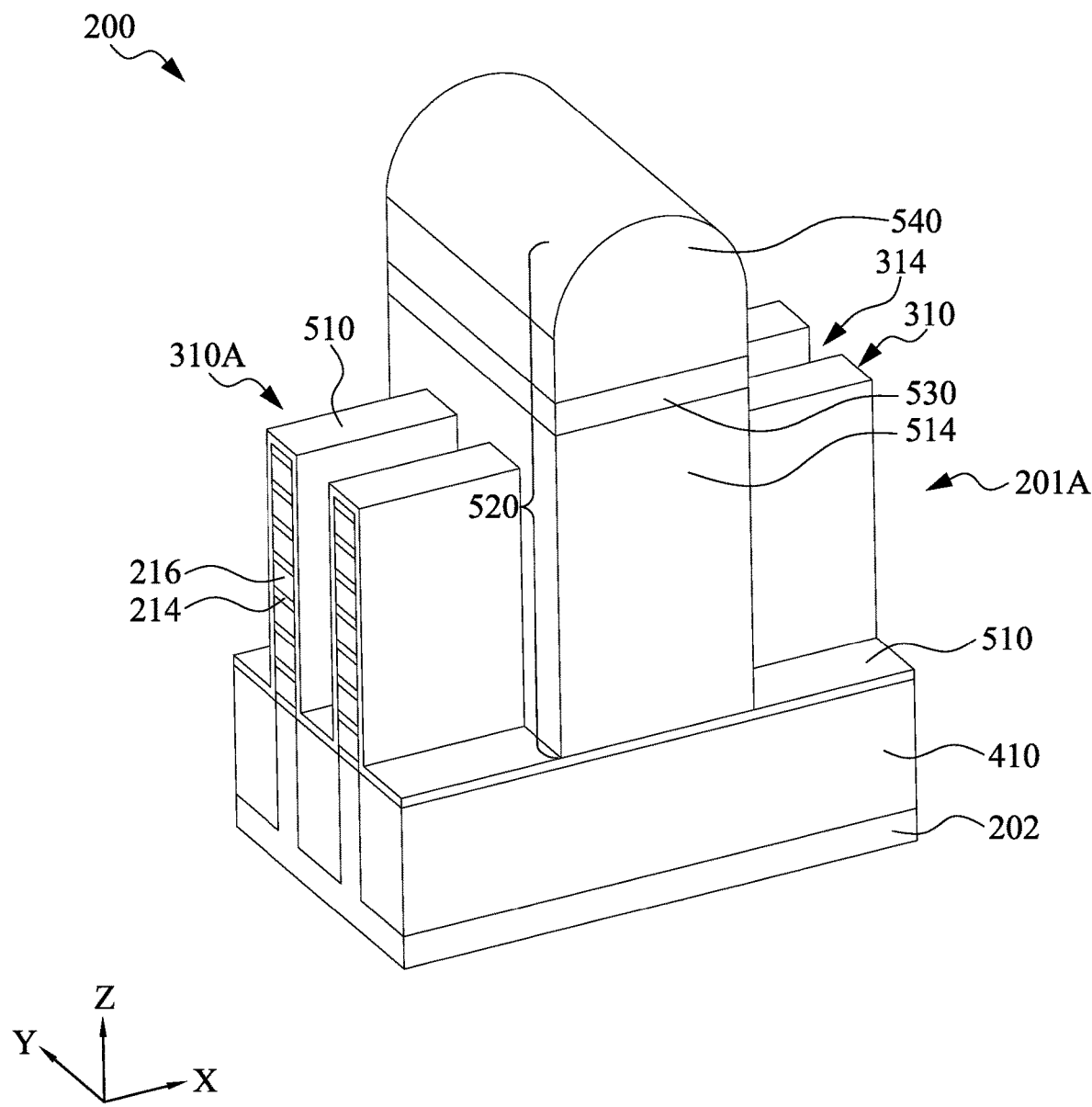

Referring to FIG. 5, a dummy gate structure 520 is formed over the upper fins 310A. In some embodiments, the dummy gate structure 520 is replaced by a final gate structure 1400 (see FIG. 14A) at subsequent processing steps. In some embodiments, the dummy gate structure 520 is formed over the substrate 202 and is at least partially disposed over the upper fins 310A. Portions of the upper fins 310A underlying the dummy gate structure 520 are referred to as channel regions.

In some embodiments, the dummy gate structure 520 includes a dummy dielectric layer 510, an electrode layer 514, a HM layer 530, and a photoresist layer 540. In some embodiments, the dummy gate structure 520 is formed by various process steps such as layer deposition, patterning, etching, as well as other suitable processing steps. Exemplary layer deposition processes includes CVD (including both low-pressure CVD and plasma-enhanced CVD), PVD, ALD, thermal oxidation, e-beam evaporation, or other suitable deposition techniques, or combinations thereof. In forming the dummy gate structure 520, for example, the patterning process includes a lithography process (e.g., photolithography or e-beam lithography) that may further include photoresist coating (e.g., spin-on coating), soft baking, mask aligning, exposure, post-exposure baking, photoresist developing, rinsing, drying (e.g., spin drying and/or hard baking), other suitable lithography techniques, and/or combinations thereof. In some embodiments, the etching process may include dry etching (e.g., reactive ion etching), wet etching, and/or other etching methods.

In some embodiments, the dummy dielectric layer 510 is formed over the upper fins 310A. In some embodiments, the dummy dielectric layer 510 includes $SiO_2$, silicon nitride, a high dielectric constant (high-k) dielectric material and/or other suitable material. In some embodiments, the dummy dielectric layer 510 includes multiple layers. In various examples, the dummy dielectric layer 510 may be deposited by a CVD process, a SACVD process, a flowable CVD process, an ALD process, a PVD process, or other suitable process. By way of example, the dummy dielectric layer 510 is used to prevent damage to the upper fins 310A by subsequent processing.

In some embodiments, the dummy dielectric layer 510 is not included in the dummy gate structure 520. In some embodiments, the dummy dielectric layer 510 may be removed prior to the deposition of the electrode layer 514. In some embodiments, an additional dielectric layer is included in the dummy gate structure 520. In some examples, the additional dielectric layer includes silicon nitride, a high-k dielectric material or other suitable material. In some embodiments, the electrode layer 514 includes polycrystalline silicon (polysilicon). In some embodiments, the HM layer 530 includes an oxide layer such as a pad oxide layer of $SiO_2$. In some embodiments, the HM layer 530 includes the nitride layer such as a pad nitride layer that includes $Si_3N_4$, silicon oxynitride and/or silicon carbide. In some embodiments, the HM layer 530 includes multiple layers (e.g., an oxide layer and a nitride layer, as described above).

Figure 6:
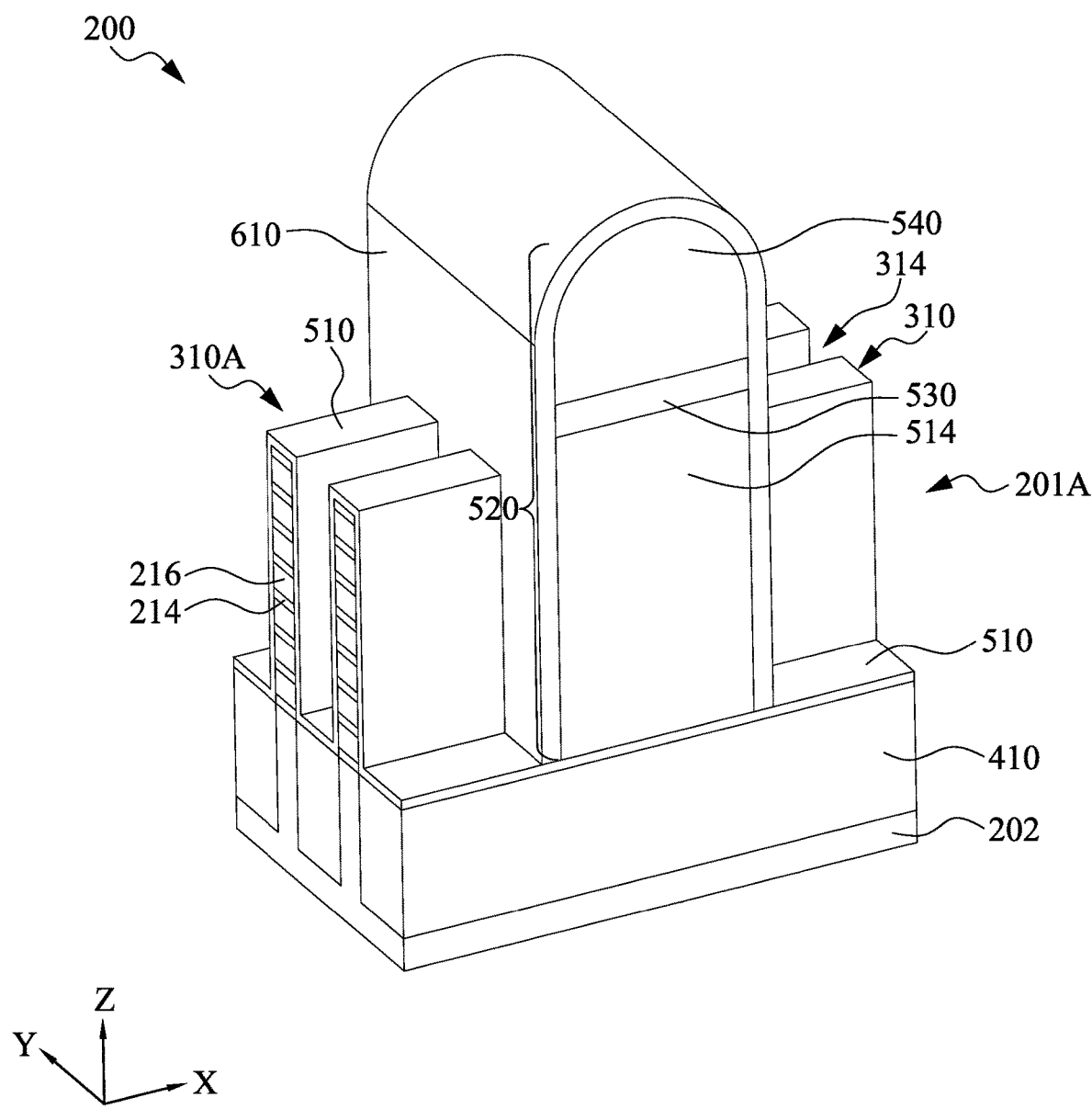

Referring to FIG. 6, a spacer layer 610 is formed over the substrate 202. In some embodiments, the spacer layer 610 is a conformal dielectric layer formed over the substrate 202. The spacer layer 610 forms spacer elements on sidewalls of the dummy gate structure 520.

In some embodiments, the spacer layer 610 includes a dielectric material such as silicon oxide, silicon nitride, silicon carbide, silicon oxynitride, SiCN, silicon oxycarbonitride (SiOCN), and/or a combination thereof. In some examples, the spacer layer 610 includes multiple layers, such as main spacer walls, liner layers, and the like. By way of an example, the spacer layer 610 is formed by depositing a dielectric material over the dummy gate structure 520 using processes such as, CVD process, a SACVD process, a flowable CVD process, an ALD process, a PVD process, or other suitable process. In some embodiments, the deposition is followed by an etching-back (e.g., anisotropically) of the dielectric material.

Figure 7:
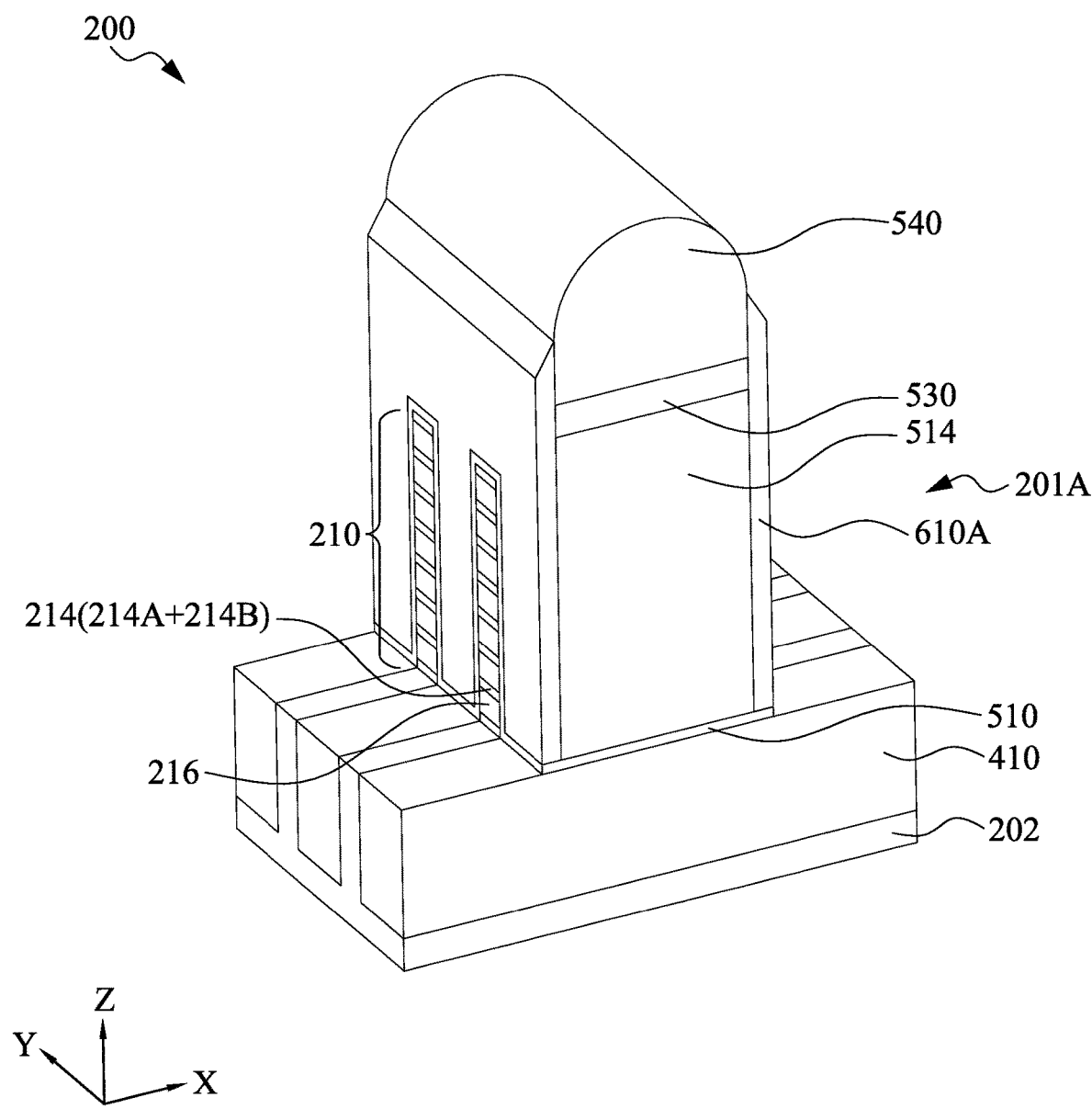

Referring to FIG. 7, portions of the upper fins 310A that are adjacent the channel regions underlying the dummy gate structure 520 are removed using an etch process. In some embodiments, the spacer layer 610 and the dummy dielectric layer 510 are removed from exposed regions of the substrate 202 not covered by the dummy gate structure 520. As shown in FIG. 7, a portion of the spacer layer 610 that is shown as spacer elements 610A remains on the sidewalls of the dummy gate structure 520. In some embodiments, the first epitaxial layers 214 includes two portions, first portions 214A that underlie the spacer elements 610A and are not covered by the dummy gate structure 520 and second portions 214B that are covered by the dummy gate structure 520. The etch process may include a dry etch (e.g., reactive ion etching), a wet etch, and/or a combination thereof.

Figure 8:
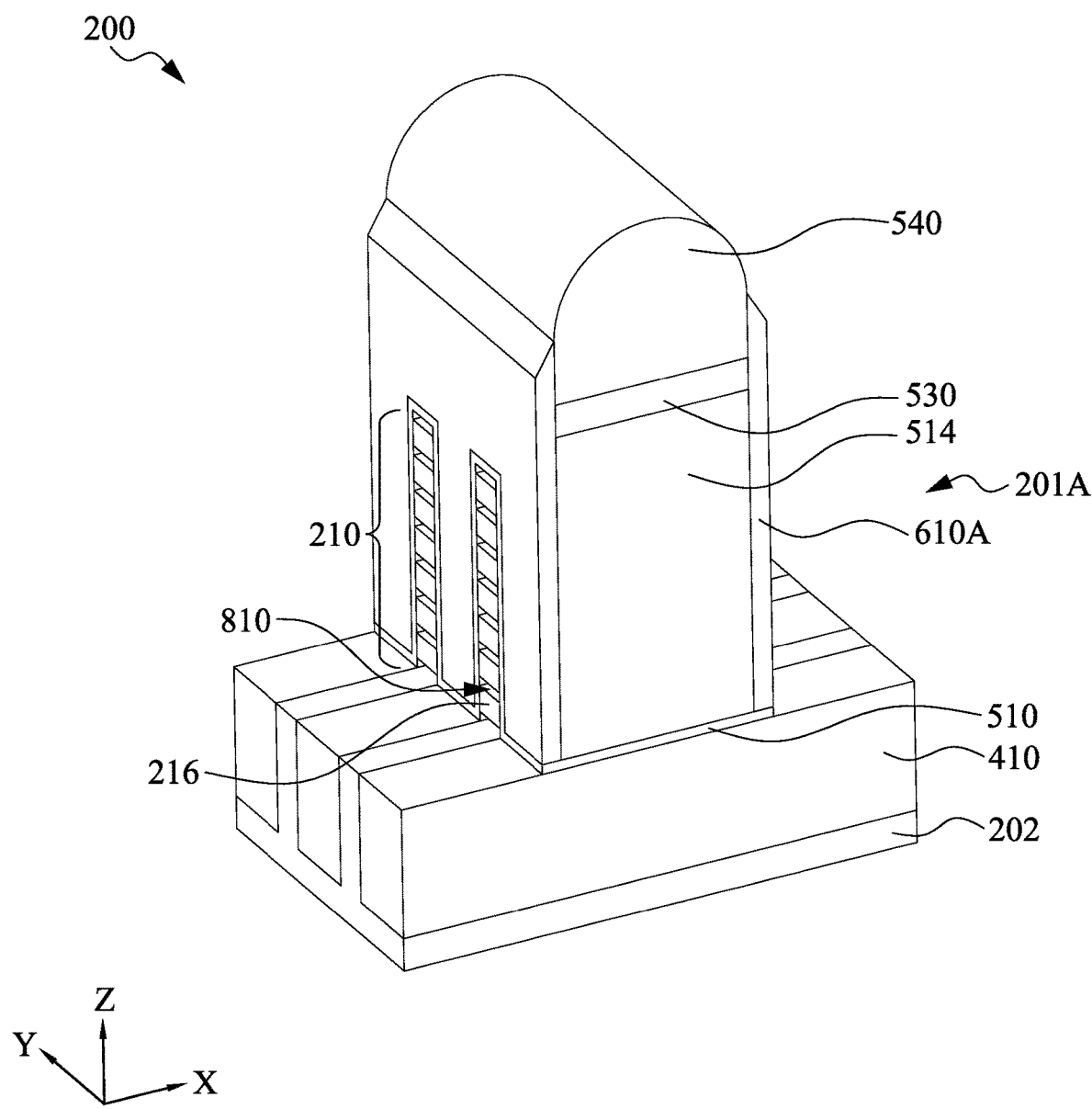

Referring to FIG. 8, the first portions 214A of the first epitaxial layers 214 are removed to form first gaps 810 between the second epitaxial layers 216. Removing the first portions 214A of the first epitaxial layers 214 can be performed by a suitable etch process, such as a wet etch, a dry etch, and/or a combination thereof. The etch process is chosen to selectively etch the first epitaxial layers 214 without substantially etching the second epitaxial layers 216. In some examples, the second portions 214B of the first epitaxial layers 214 remain in the channel region.

FIG. 8 illustrates the first gaps 810 in place of the removed first portions 214A of the first epitaxial layers 214. The first gaps 810 are filled with the ambient environment (e.g., air or $N_2$). In some embodiments, the first portions 214A of the first epitaxial layers 214 are removed by a selective wet etching process. In some embodiments, the selective wet etching includes an APM etch (e.g., ammonia hydroxide-hydrogen peroxide-water mixture). In some embodiments, the selective removal includes SiGe oxidation followed by a $SiGeO_x$ removal. For example, the oxidation is provided by $O_3$ clean and then $SiGeO_x$ is removed by an etchant such as $NH_4OH$. In some embodiments, the first epitaxial layers 214 are SiGe and the second epitaxial layers 216 are silicon allowing for the selective removal of the first portions 214A of the first epitaxial layers 214.

Figure 9:
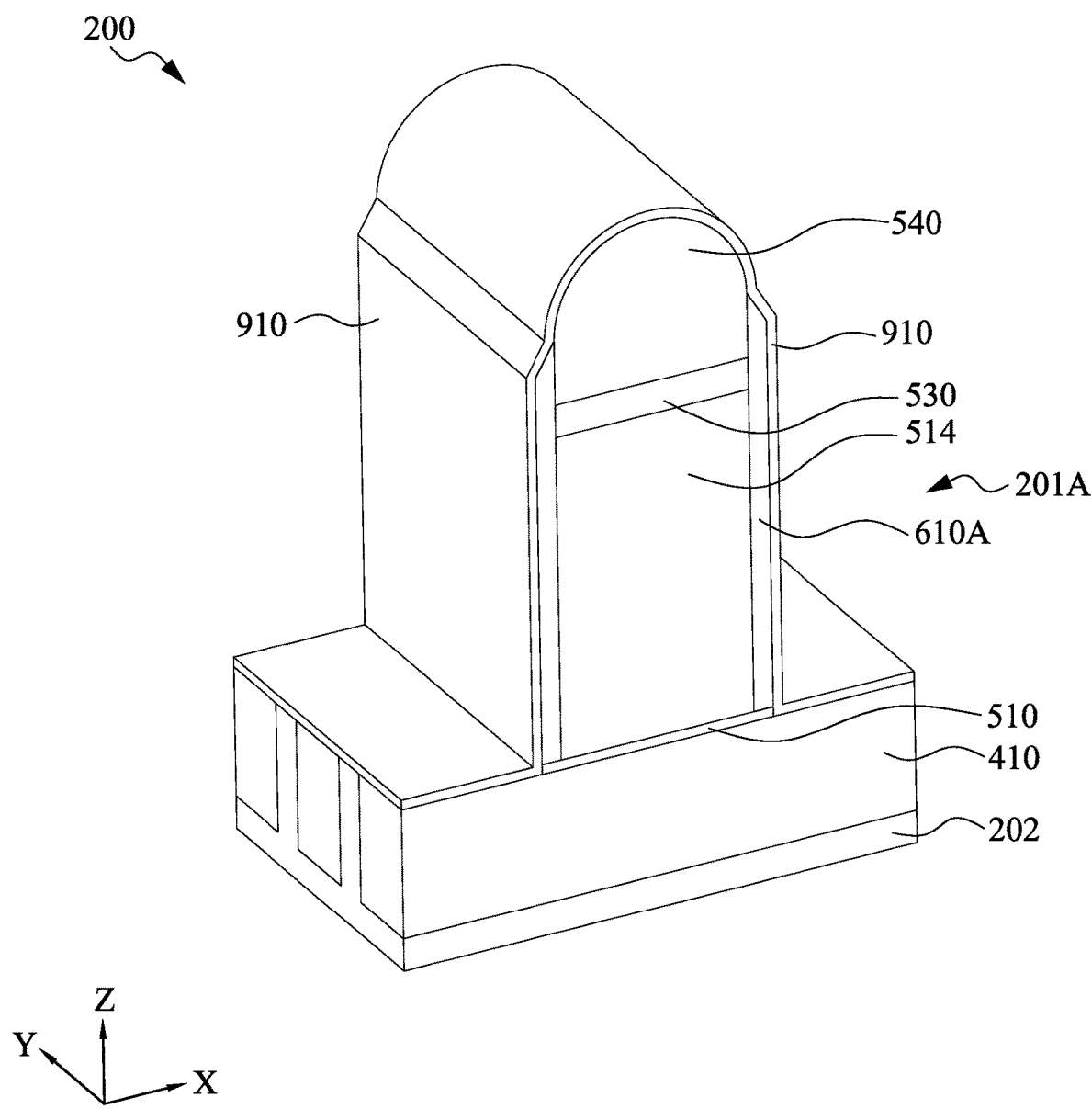

Referring to FIG. 9, an inner spacer layer 910 is formed over the substrate 202. In some embodiments, the inner spacer layer 910 is a conformal dielectric layer formed over the substrate 202. In some embodiments, the inner spacer layer 910 covers the spacer elements 610A, and fills in the first gaps 810.

In some examples, the inner spacer layer 910 includes a dielectric material such as silicon oxide, silicon nitride, and/or a combination thereof. In some embodiments, the inner spacer layer 910 includes multiple layers. In some embodiments, the inner spacer layer 910 is formed similarly in many respects to the spacer layer 610 described above in FIG. 6.

Figure 10:
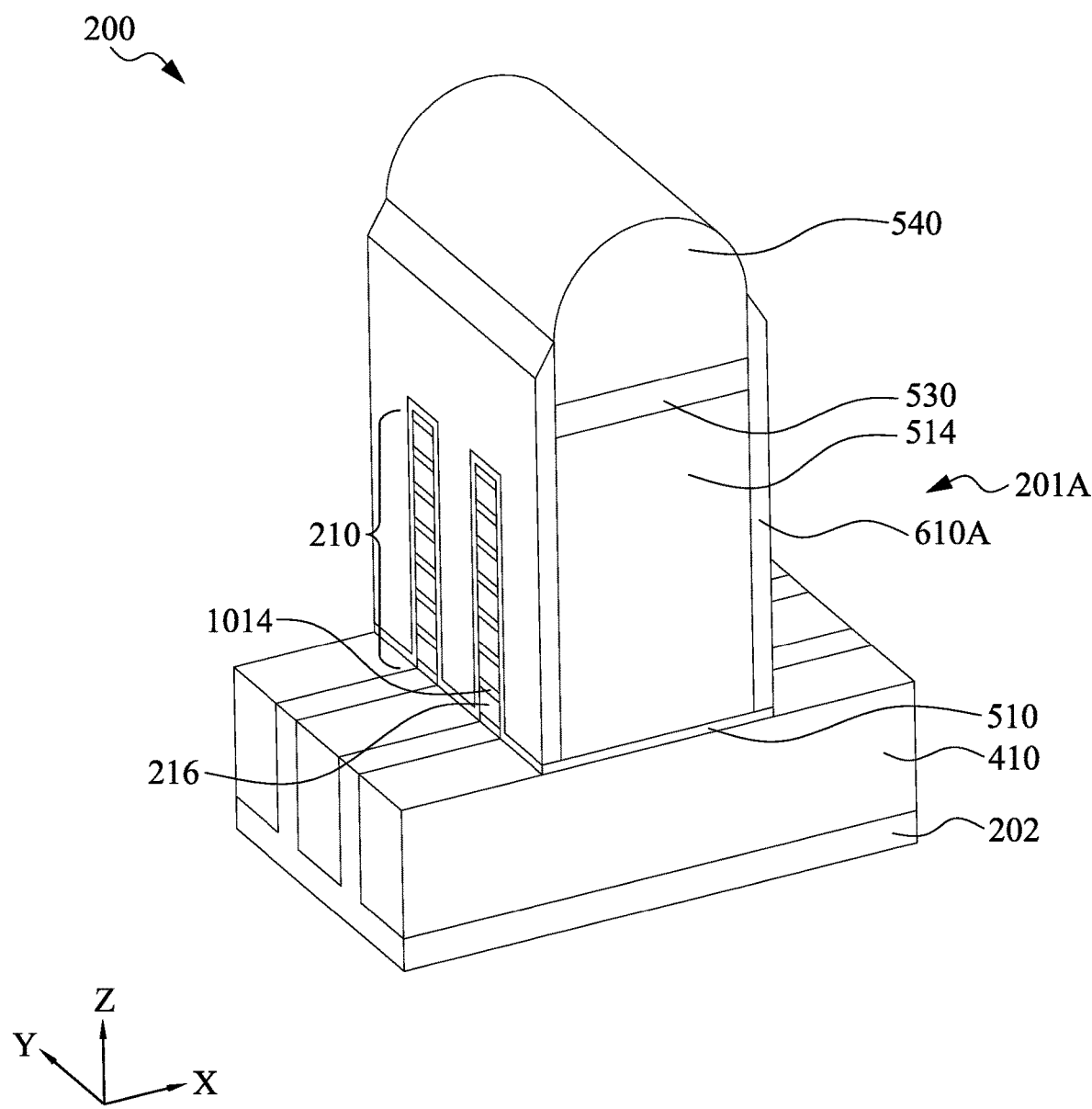

Referring to FIG. 10, portions of the inner spacer layer 910 that are exposed outside the spacer elements 610A are removed. The inner spacer 910 is removed from a top surface and sidewalls of the dummy gate structure 520 as well as from the substrate 202 and the STI structures 410, but portions of the inner spacer 910 in the spacer elements 610A remain between the second epitaxy layers 216 as shown by remaining inner spacers 1014. In some examples, the inner spacers 1014 fill in the first gaps 810. In some embodiments, the inner spacer layer 910 is removed by a dry etching process, a wet etching process, and/or a combination thereof. In some embodiments, the inner spacers 1014 provide an etch stop layer during subsequent processing.

Figure 11:
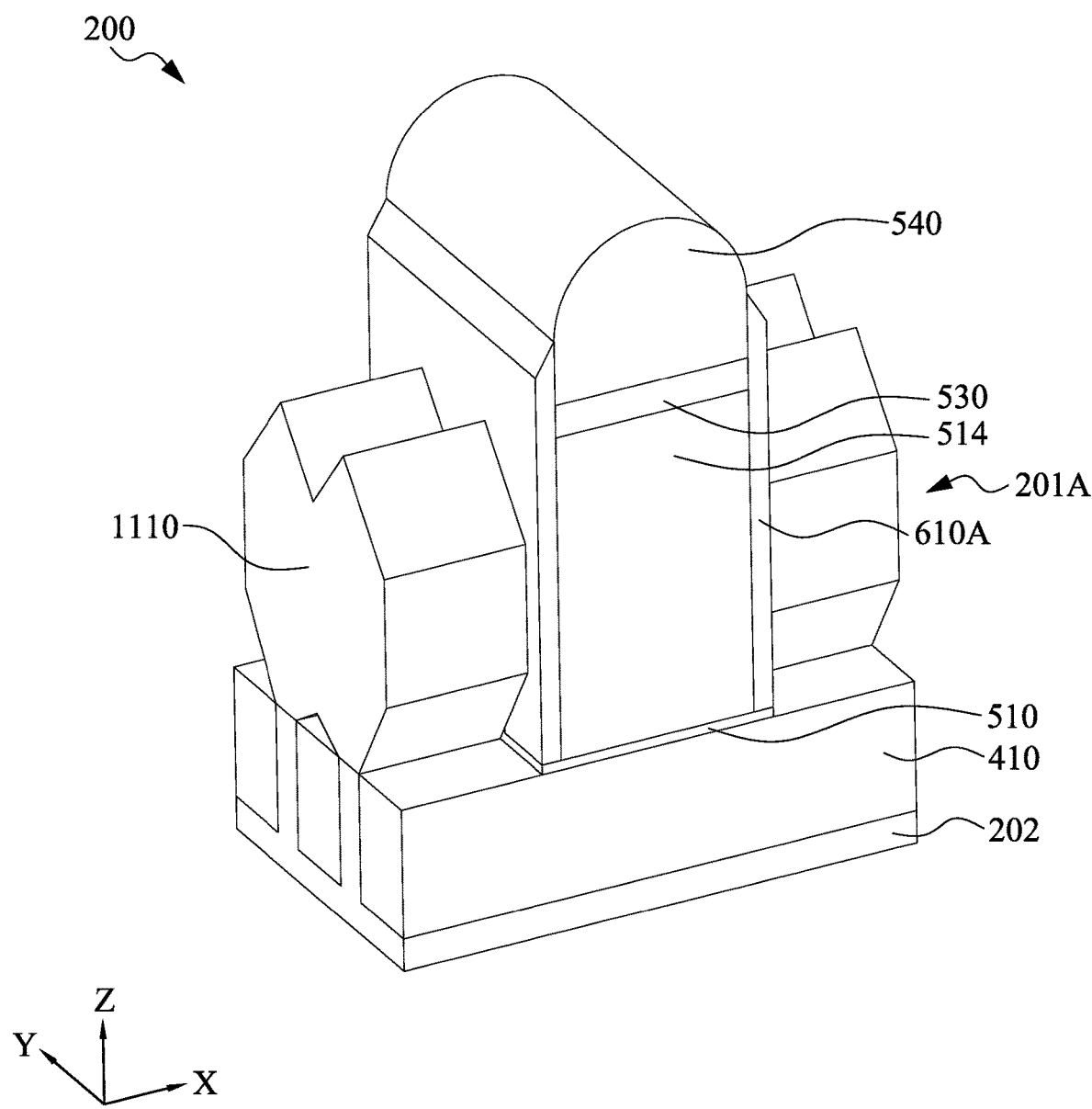

Referring to FIG. 11, source/drain (S/D) features 1110 are formed. In some embodiments, the S/D features 1110 are configured to form S/D terminals to the transistor 201A. In some embodiments, the S/D features 1110 are formed by performing an epitaxial growth process that provides an epitaxy material extending from the substrate 202 and covering the upper fins 310A that underlie the dummy gate structure 520. In some embodiments, the S/D features 1110 are formed by epitaxially growing a semiconductor material. In various embodiments, the epitaxially grown semiconductor material may include Ge, Si, GaAs, AlGaAs, SiGe, GaAsP, SiP, or other suitable material. In some embodiments, the epitaxially grown semiconductor material is in-situ doped during an epitaxial process. For example, the epitaxially grown semiconductor material is doped with boron. In some embodiments, the epitaxially grown semiconductor material is doped with carbon to form Si:C S/D features, phosphorous to form Si:P S/D features, or both carbon and phosphorous to form SiCP S/D features. In some embodiments, the second epitaxial layer 216 is silicon and the epitaxially grown semiconductor material is also silicon. In some embodiments, the second epitaxial layer 216 and the epitaxially grown semiconductor material comprise a similar material, but are differently doped. In other embodiments, the second epitaxy layer 216 includes a first semiconductor material, the epitaxially grown semiconductor material includes a second semiconductor material different than the first semiconductor material. In some embodiments, the epitaxially grown semiconductor material is not in-situ doped, and, for example, an implantation process is performed to dope the epitaxially grown semiconductor material.

Figure 12:
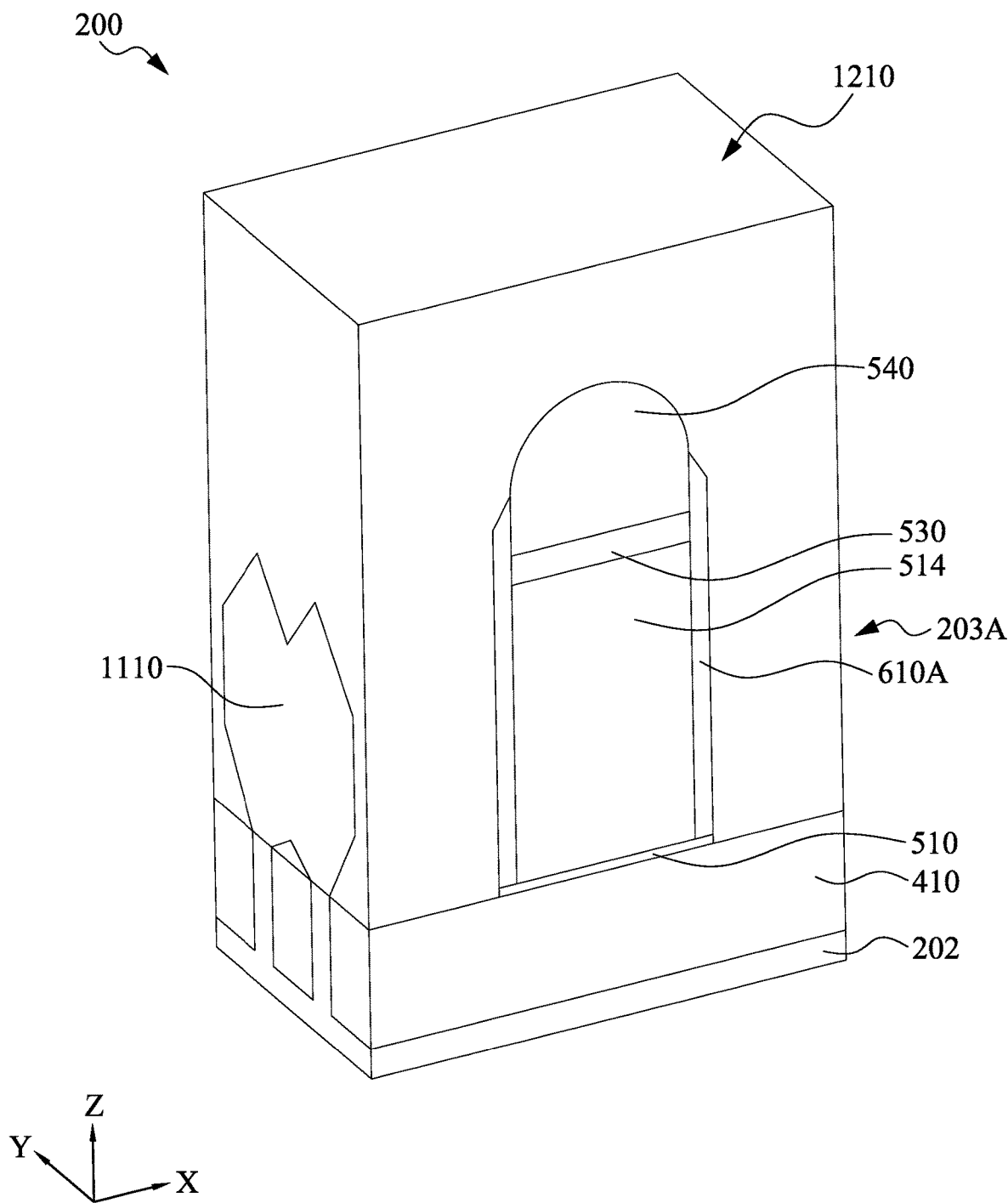

Referring to FIG. 12, an inter-layer dielectric (ILD) layer 1210 is formed over the substrate 202. In some embodiments, the ILD layer 1210 includes materials such as tetra-ethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 1210 may be deposited by a PECVD process or other suitable deposition technique. In some embodiments, after formation of the ILD layer 1210, the semiconductor structure 200 is subject to a high thermal budget process to anneal the ILD layer 1210.

Figure 13:
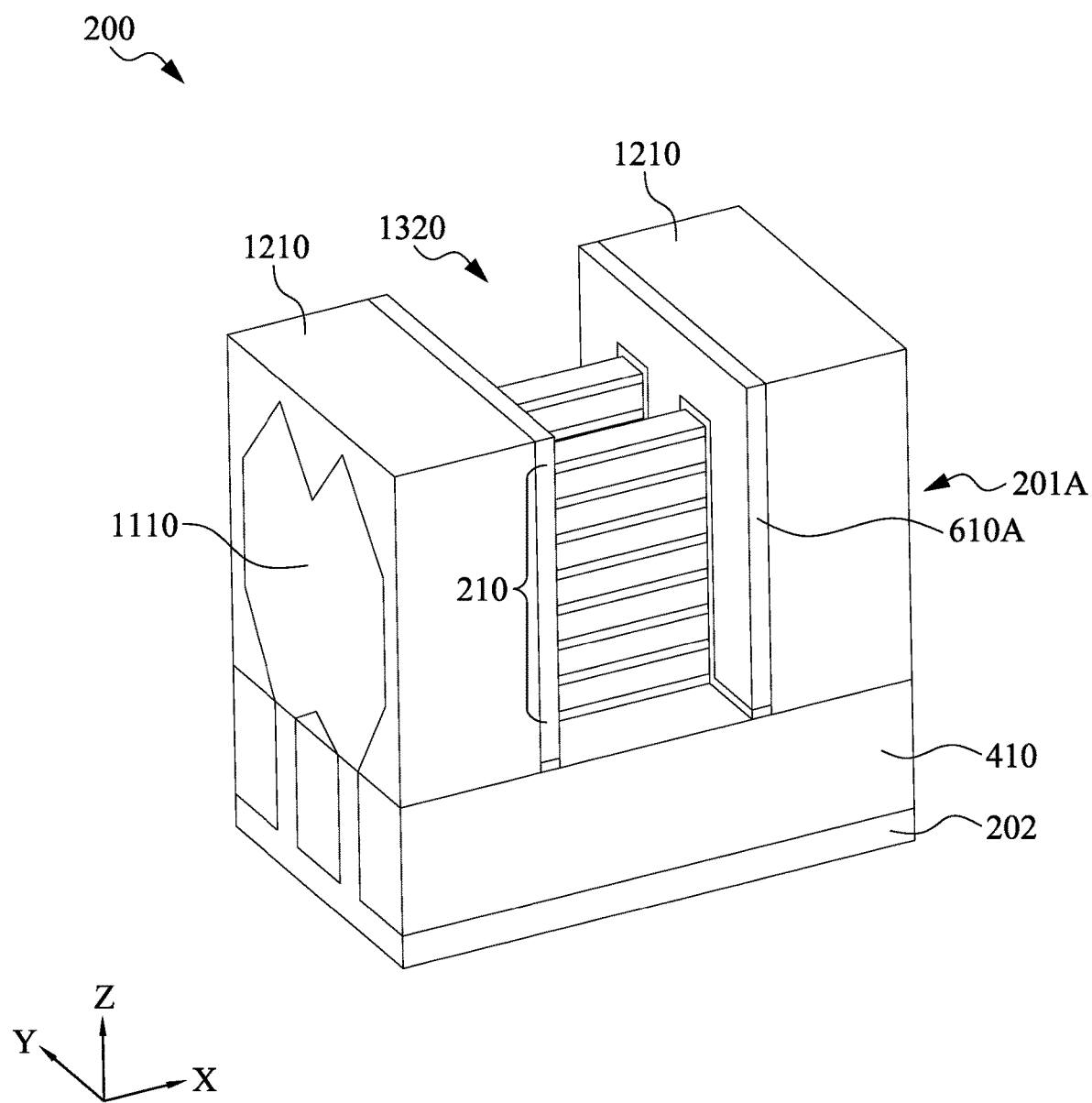

Referring to FIG. 13, the dummy gate structure 520 is removed to expose the upper fins 310A. In some examples, after depositing the ILD layer 1210, a planarization process is performed to expose a top surface of the dummy gate structure 520. For example, the planarization process includes a CMP process that removes portions of the ILD layer 1210 overlying the dummy gate structure 520 and planarizes a top surface of the semiconductor structure 200. In addition, the CMP process removes the HM layer 530 overlying the dummy gate structure 520 to expose the electrode layer 514. Thereafter, in some embodiments, the remaining dummy gate structure 520 is removed from the substrate 202. In some embodiments, the electrode layer 514 and the dummy dielectric layer 510 are removed. In some alternative embodiments, the electrode layer 514 is removed while the dummy dielectric layer 510 is not removed. The removal of the dummy gate structure 520 results in a gate trench 1320 illustrated in FIG. 13. The dummy gate structure 520 may be removed using a selective etch process such as a selective wet etch, a selective dry etch, or a combination thereof.

In some embodiments, as shown in FIG. 13, the dummy dielectric layer 510 is removed. The dummy dielectric layer 510 is removed similarly in many respects to the etching process described above association with FIG. 7. In the present embodiment, the etch process is chosen to selectively etch the dummy dielectric layer 510 without substantially etching the upper fins 310A, the spacer elements 610A, and the STI structures 410.

Figure 14A:
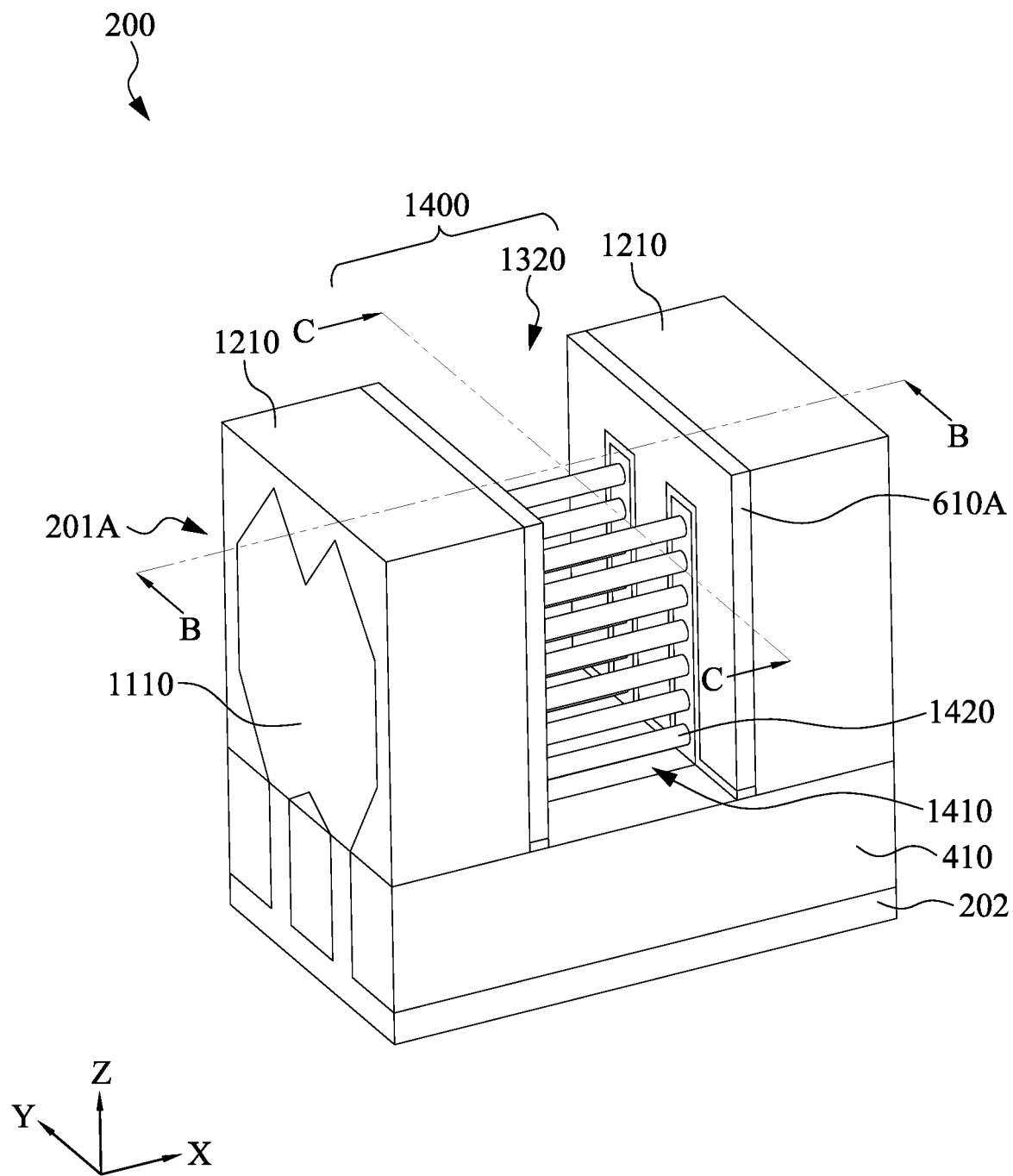
Figure 14B:
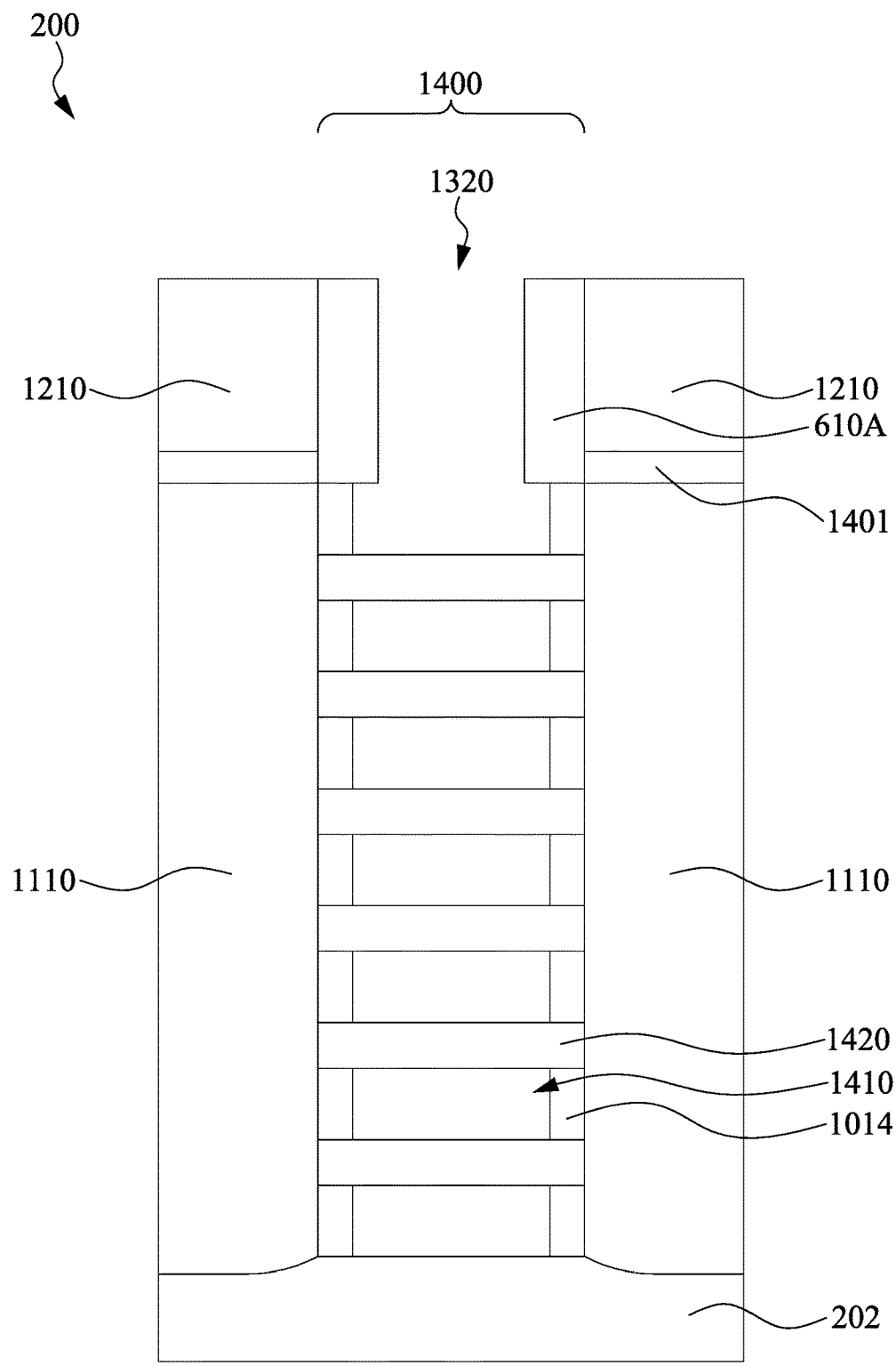
FIGS. 14B, 15B, 16B, and 17B illustrate cross-sectional views of a semiconductor structure taken along line B-B of FIGS. 14A, 15A, 16A, and 17A, respectively, in accordance with some embodiments of the present disclosure.
Figure 14C:
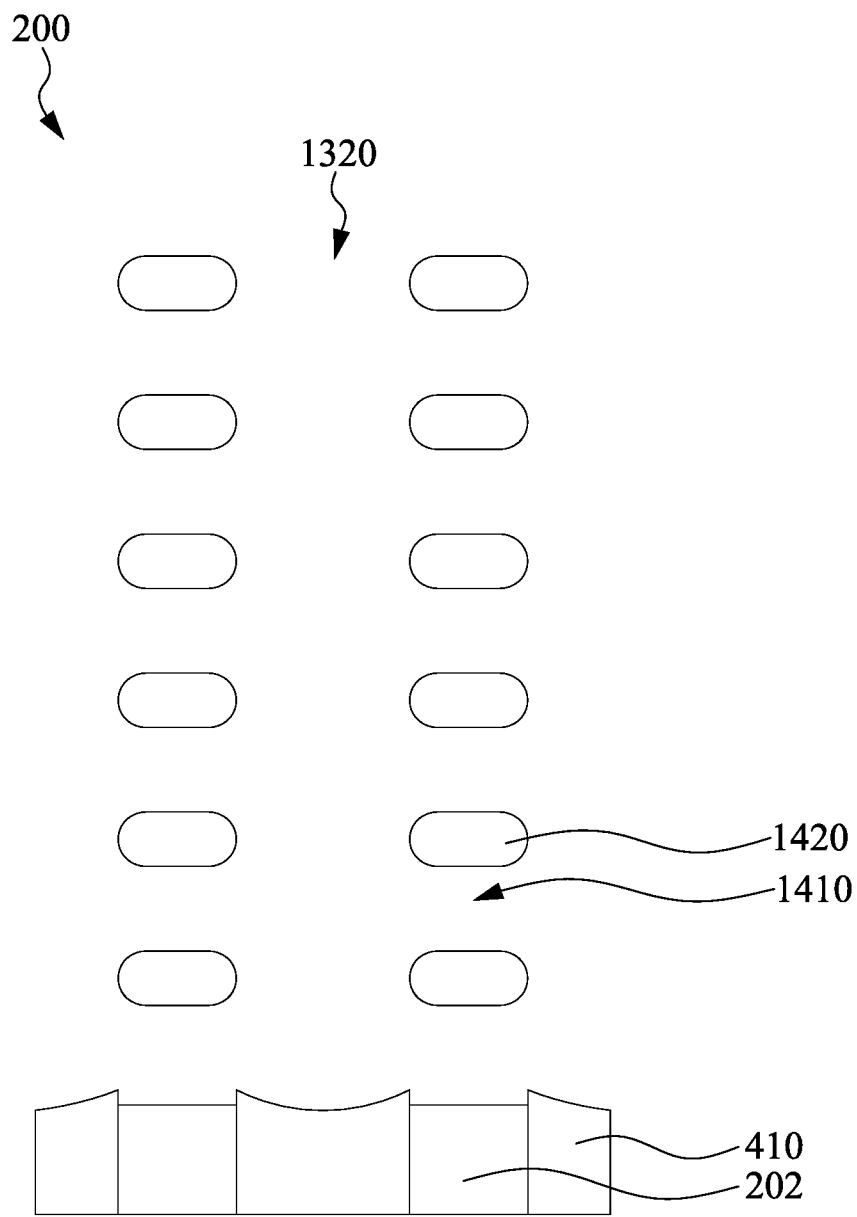
FIGS. 14C, 15C, 16C, and 17C illustrate cross-sectional views of a semiconductor structure taken along line C-C of FIGS. 14A, 15A, 16A, and 17A, respectively, in accordance with some embodiments of the present disclosure.

Referring to FIGS. 14A, 14B and 14C, the second portions 214B of the first epitaxial layers 214 in the gate trenches 1320 are removed to form channel structures 1420 using the remaining second epitaxial layers 216. In some embodiments, the channel structures 1420 are nanosheet channel structures formed of a plurality of parallel nanosheets. A nanosheet in the nanosheet channel structure 1420 generally refers to a two-dimensional semiconductor slab with a length or width greater than about 100 nm and a thickness less than about 20 nm. The nanosheet may extend in a direction, e.g., the x-axis, in which the substrates 202 extends. In some embodiments, the nanosheet channel structure 1420 extends in a direction perpendicular to the direction in which the dummy gate structure 520 extends. In some embodiments, the channel structures 1420 are nanowire channel structures including a plurality of nanowire layers, in which each nanowire layer include more than one nanowire. The nanowires may include a bar shape with a width less than that of a nanosheet and a length and a thickness substantially equal to those of a nanosheet. FIG. 14B illustrates a cross-section corresponding to FIG. 14A along line B-B. The cross-section along line B-B is a cross-section of the semiconductor structure 200 perpendicular to a top surface of the substrate 202 and along a lengthwise direction of channel structures, and is referred to as a channel length cross-section in the present disclosure. FIG. 14C illustrates a cross-section corresponding to FIG. 14A along line C-C. The cross-section along line C-C is a cross-section of the semiconductor structure 200 perpendicular to a top surface of the substrate 202 and perpendicular to a lengthwise direction of channel structures, and is referred to as a channel width cross-section in the present disclosure. The second portions 214B of the first epitaxial layers 214 are removed similarly in many respects to the etching process described above association with FIG. 8. FIGS. 14A, 14B and 14C illustrate second gaps 1410 in place of the removed second portions 214B of the first epitaxial layers 214. The second gaps 1410 are between the adjacent second epitaxy layers 216 in the channel region. The second gaps 1410 may be filled with the ambient environment (e.g., air or nitrogen). As a result, the second epitaxial layers 216 in the gate trench 1320 form the channel structures 1420.

In some embodiments, the channel structure 1420 is referred to as a nanosheet or a nanowire. In some embodiments, the channel structure 1420 is bar-shaped. As shown in FIG. 14C, the channel width cross-section of the channel structure 1420 has a rounded rectangular shape, but the disclosure of the present invention is not limited thereto. For example, the channel width cross-section of the channel structure 1420 may have an oval shape.

As described above, in some examples, the inner spacers 1014 serve as etch stop layers to protect the S/D features 1110 during removal of the second portions 214B of the first epitaxial layers 214 in the gate trench 1320.

Referring to FIG. 14B, in some embodiments, an additional dielectric layer 1401 is formed above the S/D feature 1110. In some examples, the additional dielectric layer 1401 is formed similarly in many respects to the process described above association with FIG. 6, thus a detailed description is omitted for clarity purposes.

In some embodiments, a final gate structure 1400, also referred to as a metal-gate structure or replacement gate structure, is subsequently formed over the channel structures 1420. Channels are formed in the respective channel structures 1420 when a suitable voltage is applied to the final gate structure 1400. Thus, the final gate structure 1400 forms a gate associated with the channels. In some embodiments, the final gate structure 1400 includes a gate dielectric layer and a metal gate that includes a plurality of metal or non-metal layers.

Figure 15A:
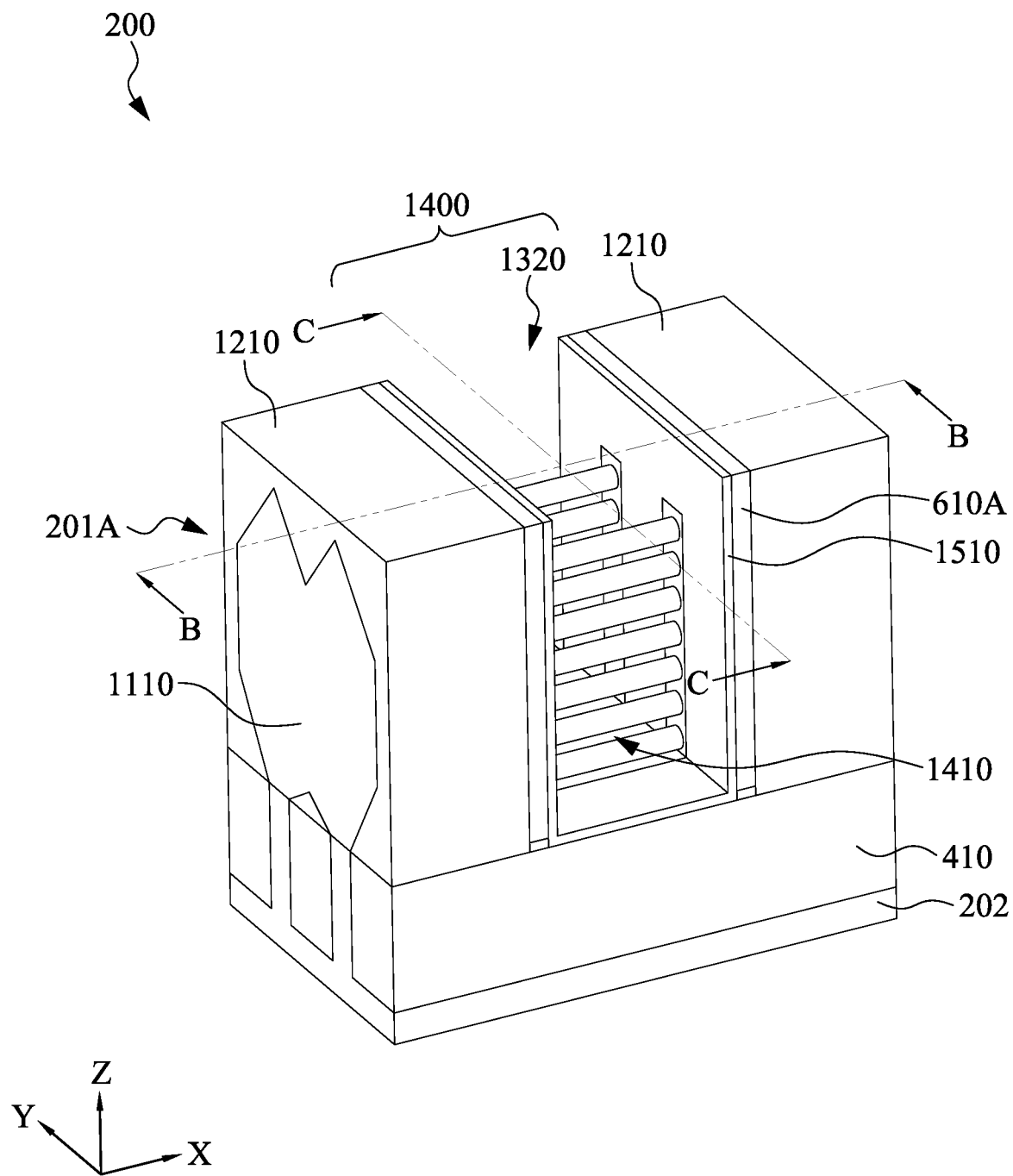
Figure 15B:
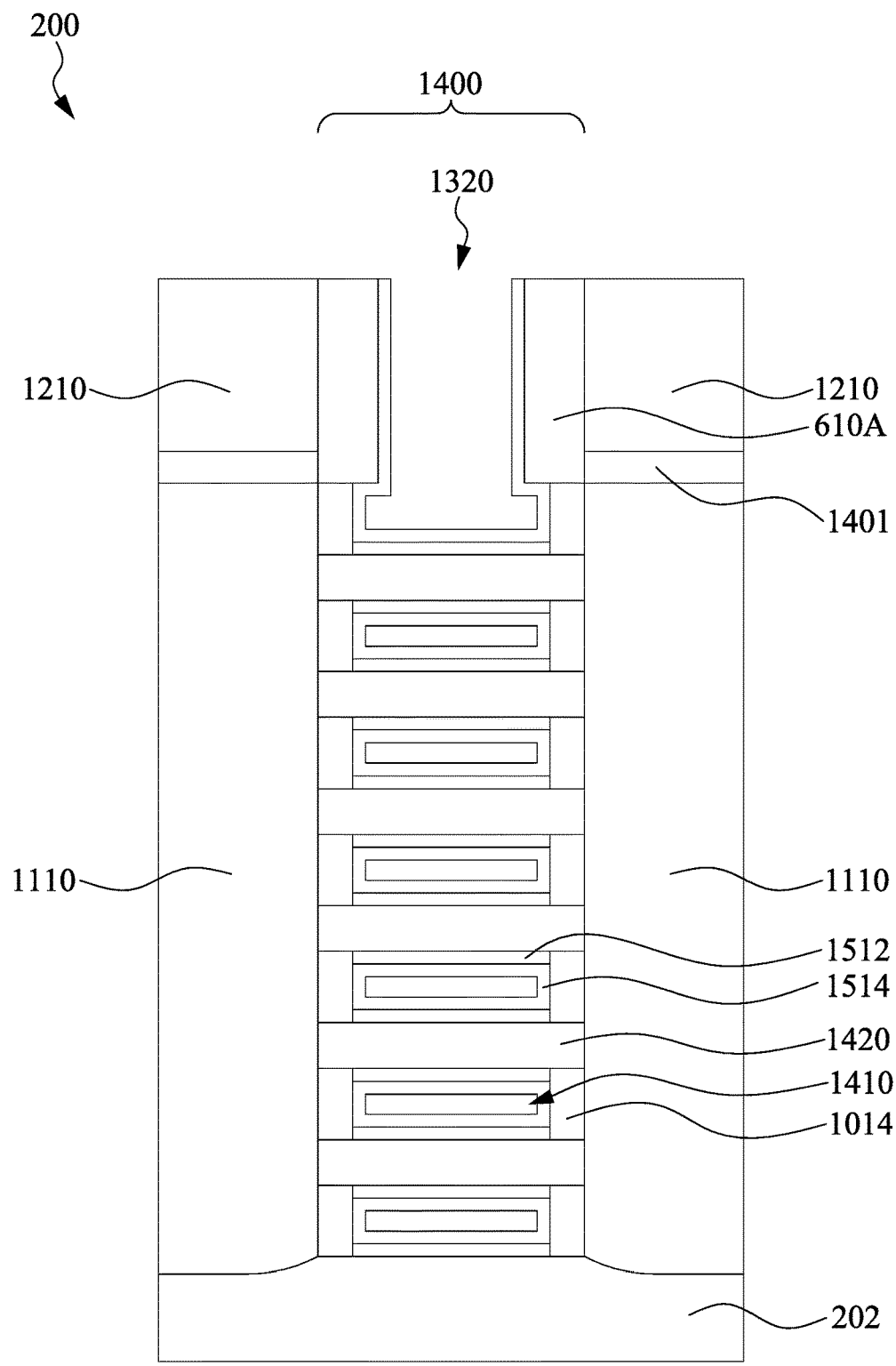
Figure 15C:
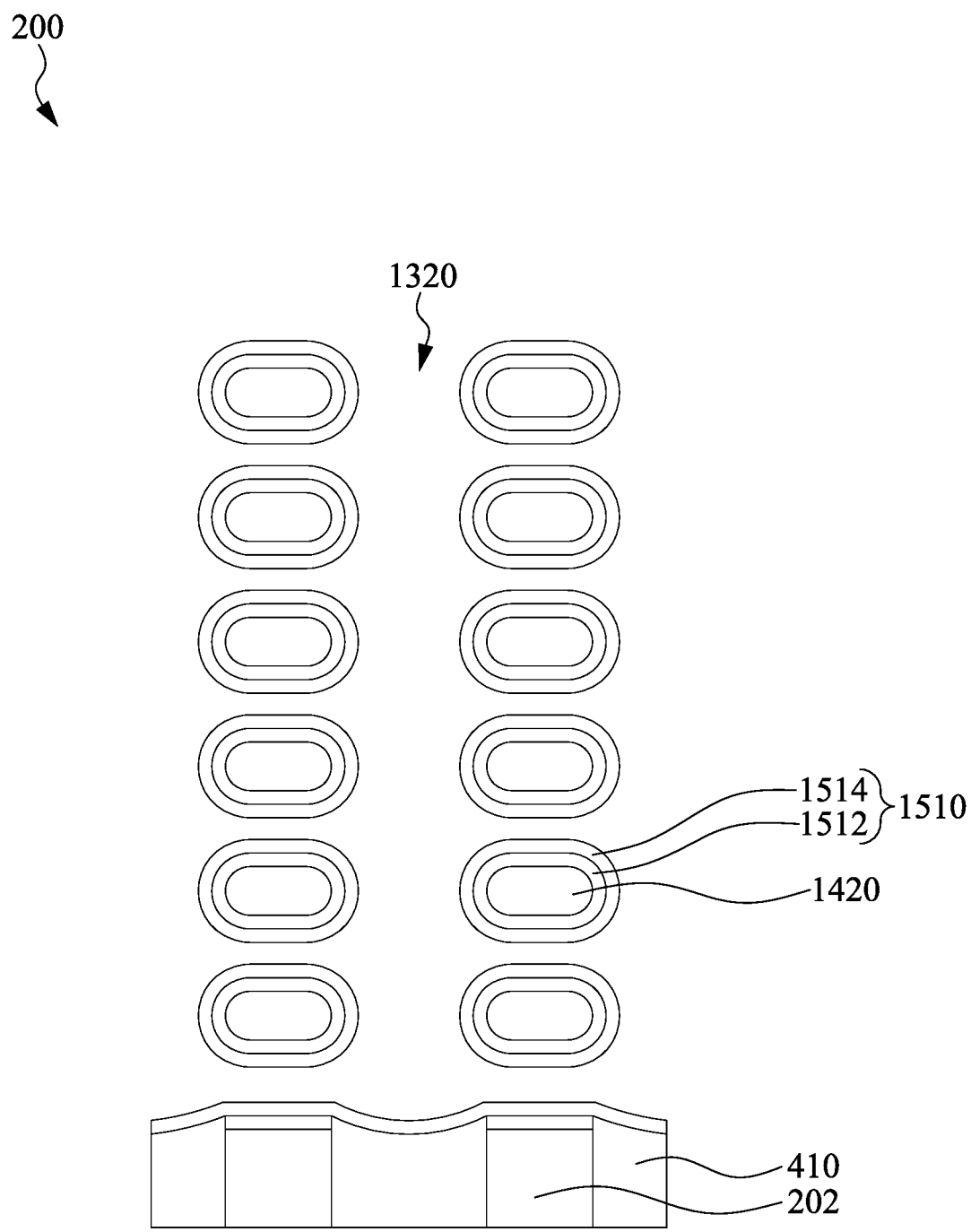

Referring to FIGS. 15A, 15B and 15C, a gate dielectric layer 1510 of the final gate structure 1400 is formed. FIG. 15B illustrates the channel length cross-section corresponding to FIG. 15A along line B-B. FIG. 15C illustrates the channel width cross-section corresponding to FIG. 15A along line C-C. In some embodiments, the gate dielectric layer 1510 includes multiple layers. In some examples, the gate dielectric layer 1510 includes an interfacial layer 1512 and a high-k dielectric layer 1514. In some embodiments, the interfacial layer 1512 is disposed around each channel structure 1420, and the high-k dielectric layer 1514 is disposed around the respective interfacial layer 1512, as shown in FIGS. 15B and 15C. After the formation of the gate dielectric layer, the second gaps 1410 between the channel structures 1420 are reduced.

In some embodiments, the interfacial layer 1512 includes a dielectric material such as silicon dioxide ($SiO_2$), hafnium silicon oxide (HfSiO), or silicon oxynitride (SiON). The interfacial layer 1512 is formed by chemical oxidation, thermal oxidation, ALD, CVD, and/or other suitable method. The high-k gate dielectric layer 1514 may include suitable high-k dielectrics, such as hafnium oxide, aluminum oxide, titanium oxide, hafnium zirconium oxide, tantalum oxide, hafnium silicon oxide, zirconium oxide, zirconium silicon oxide, lanthanide oxide, or any other suitable material, or a combination thereof. In some embodiments, the high-k gate dielectric layer 1514 includes hafnium oxide ($HfO_2$). In some embodiments, the high-k gate dielectric layer 1514 includes $HfO_2$ formed from precursors, e.g., $HfCl_4+H_2O$. In some embodiments, the high-k gate dielectric layer 1514 is formed by ALD, PVD, CVD, oxidation, and/or other suitable methods.

Figure 16A:
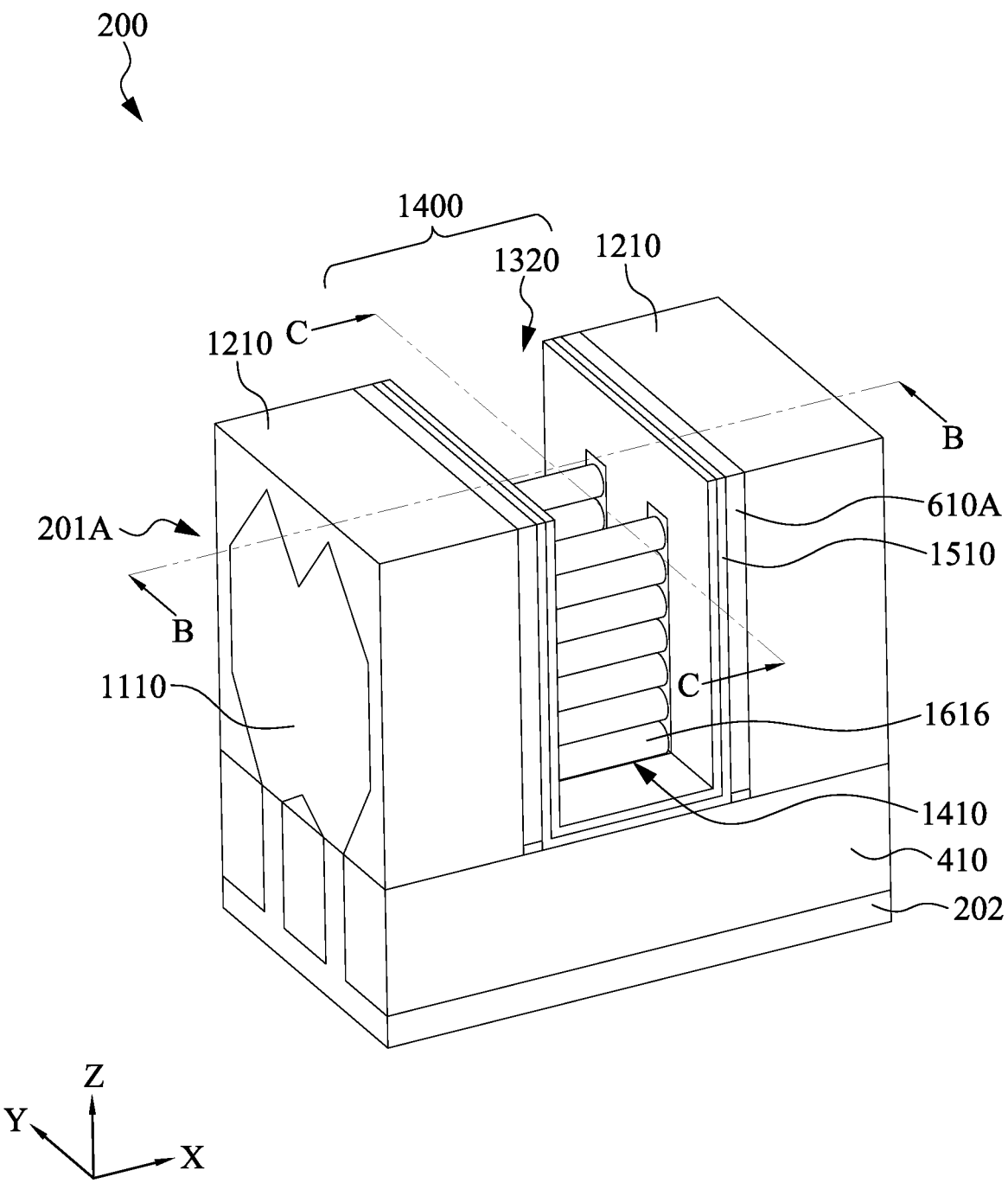
Figure 16B:
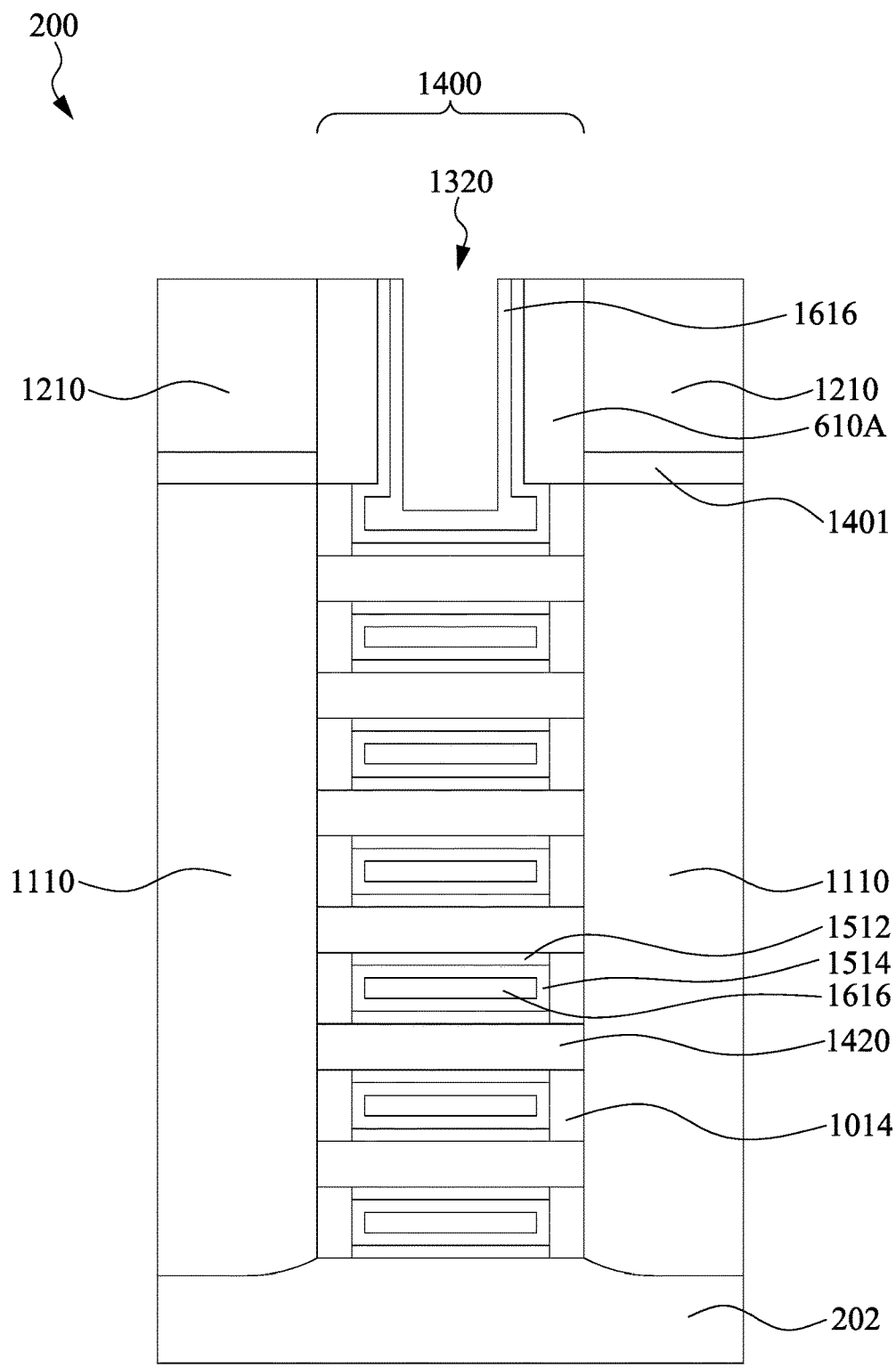
Figure 16C:
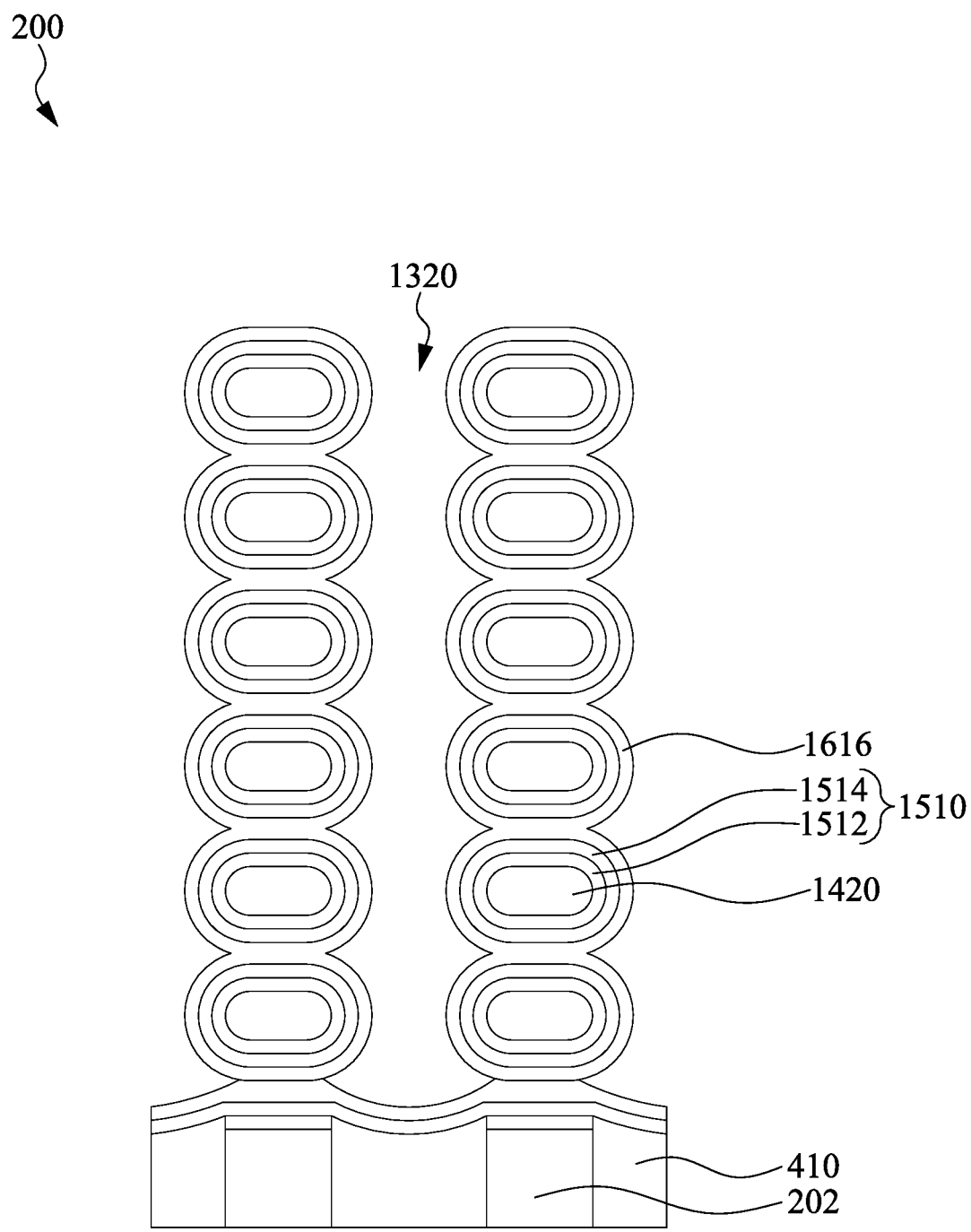

Referring to FIGS. 16A, 16B and 16C, a work function adjustment (WFA) layer 1616 of the metal gate is formed. FIG. 16B illustrates the channel length cross-section corresponding to FIG. 16A along line B-B. FIG. 16C illustrates the channel width cross-section corresponding to FIG. 16A along line C-C. The WFA layer 1616 is formed in the final gate structure 1400 of an NFET. The WFA layer 1616 may be formed to cover the gate dielectric layer 1510. In some embodiments, the WFA layer 1616 fills the space of the gap 1410 between adjacent channel structures 1420 and therefore forms a contiguous material of the WFA layer 1616 across different nanosheets or nanowires of the individual channel structures 1420.

In some embodiments, the WFA layer 1616 is a single layer. In some embodiments, the WFA layer 1616 contains non-metal elements, such as a semiconductor element. In some embodiments, the WFA layer 1616 includes silicon element. For example, the WFA layer 1616 may include a silicon-containing material formed of only silicon. In some embodiments, the WFA layer 1616 includes transition metal silicide, but the scope of the present disclosure is not limited thereto. Examples of the transition metal silicide include, but are not limited to, titanium silicide, tantalum silicide, tungsten silicide, ruthenium silicide, or a combination thereof. In some embodiment, the WFA layer 1616 comprises a combination of silicon and transition metal silicide. In some embodiments, the WFA layer 1616 in a single layer of pure silicon. The pure silicon refers to a material formed of silicon without other intentionally added chemical elements during the formation of the pure silicon material. In some examples, the pure silicon contains only silicon. In some embodiments, the WFA layer 1616 is substantially free of non-silicon element. In some embodiments, the pure silicon of the WFA layer 1616 is amorphous. In some embodiments, the WFA layer 1616 is formed of only amorphous silicon. In some embodiments, a surface of the WFA layer 1616 may be oxidized, for example, by exposure to air, and thus the WFA layer 1616 may include a pure silicon covered or wrapped around by a thin film of silicon oxide. In some embodiments, the WFA layer 1616 is substantially free of metallic components, such as aluminum. In some embodiments, the WFA layer 1616 fills in the second gaps 1410 between the adjacent channel structures 1420, as shown in FIGS. 16B and 16C. In some embodiments, the WFA layer 1616 is disposed around the high-k dielectric layer 1514.

The WFA layer 1616 in accordance with the present disclosure contains silicon element. For example, the WFA layer 1616 includes pure silicon or transition metal silicide. Therefore, the semiconductor structure 200 with the WFA layer 1616 can achieve a desired band-edge work function (e.g., about 4.2 eV) with a relatively small thickness of the WFA layer 1616, e.g., less than about 15 Angstrom. With introduction of the silicon element to the WFA layer 1616, the dimension of the WFA layer 1616 can be further reduced. In some embodiments, a thickness of the WFA layer 1616 is no more than about 15 Angstrom. Therefore, the WFA layer 1616 is suitable for use in advanced technology nodes.

In some embodiments, the WFA layer 1616 may be formed by CVD or other suitable process. In some embodiments, the WFA layer 1616 is formed from a silicon-containing precursor. Examples of the silicon-containing precursor include, but are not limited to, silane ($SiH_4$), disilane ($Si_2H_6$), or the like. In some embodiments, the WFA layer 1616 is formed by a CVD operation at a temperature in a range of between approximately 300° C. and approximately 600° C. for a soak time of between approximately 10 seconds and approximately 30 minutes. In some embodiments, the WFA layer 1616 is formed from a silicon-containing precursor and a transition metal precursor. Examples of the transition metal precursor include, but are not limited to, transition metal chloride, transition metal fluoride, or the like, such as titanium chloride, tantalum chloride or tungsten fluoride. In some embodiments, after the WFA layer 1616 is formed, the semiconductor structure 200 may be annealed, for example, to improve the quality of the WFA layer 1616. In some embodiments, the WFA layer 1616 may be exposed to air and a surface of the WFA layer 1616 may be oxidized.

Figure 17A:
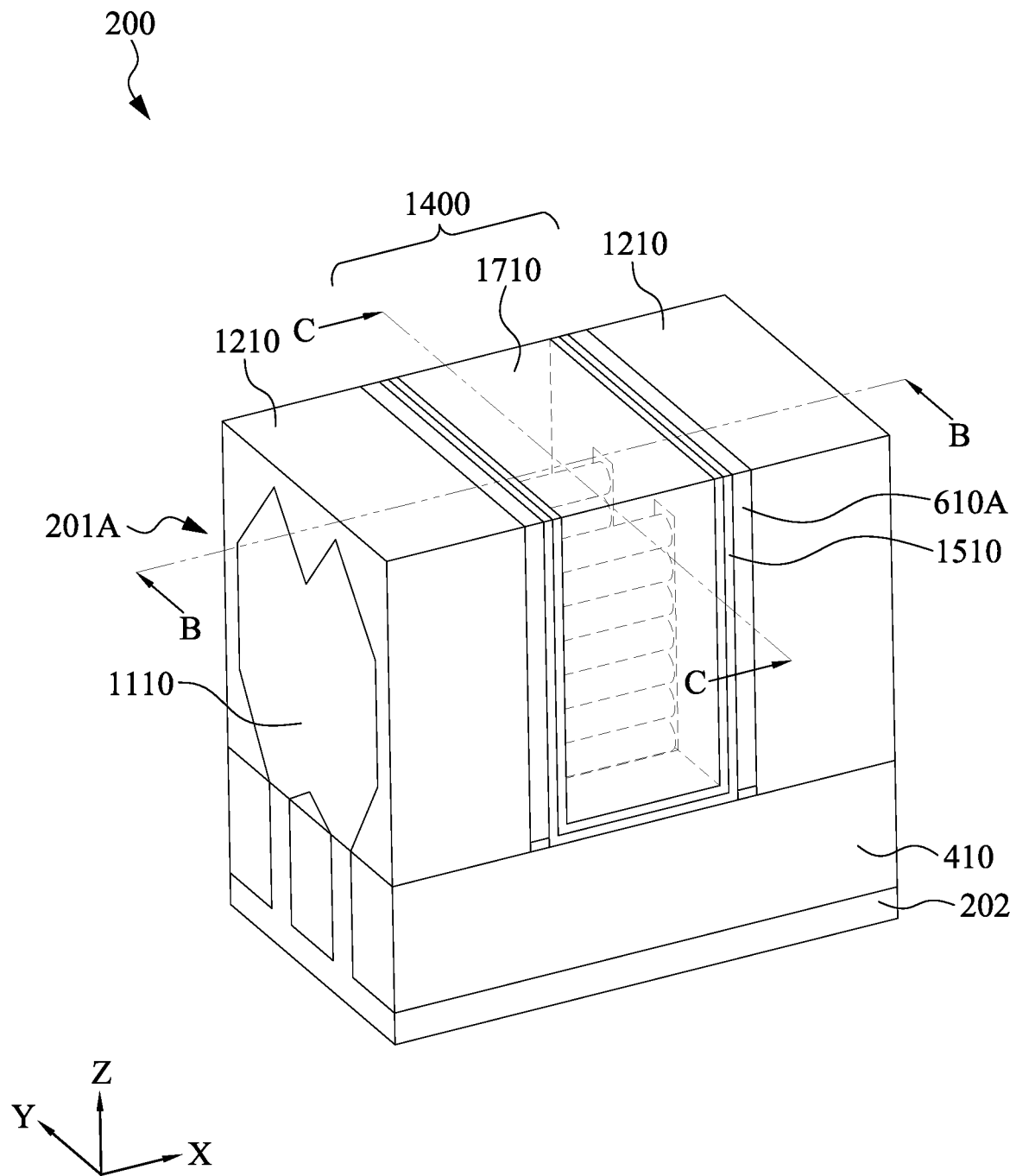
Figure 17B:
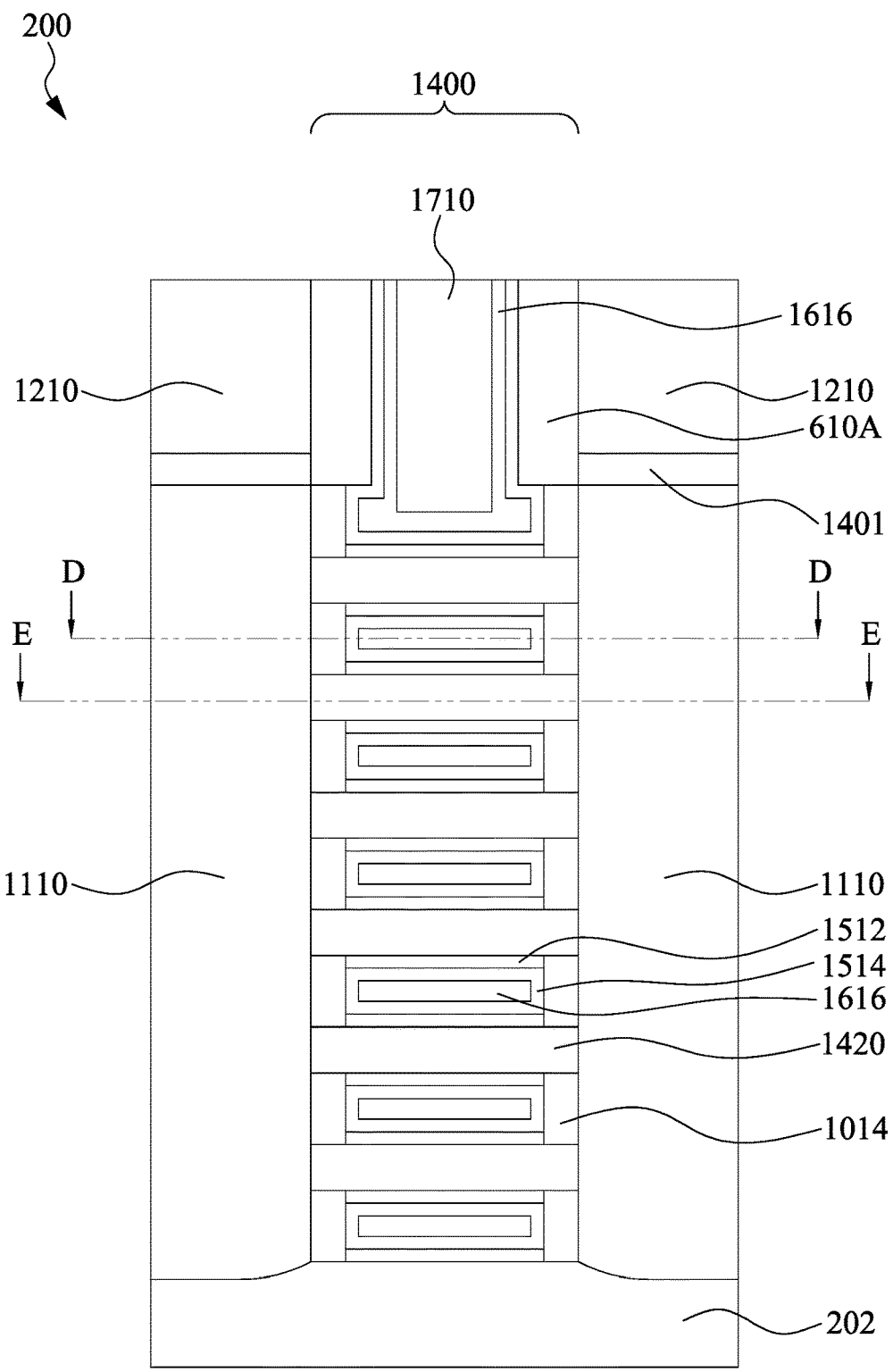
Figure 17C:
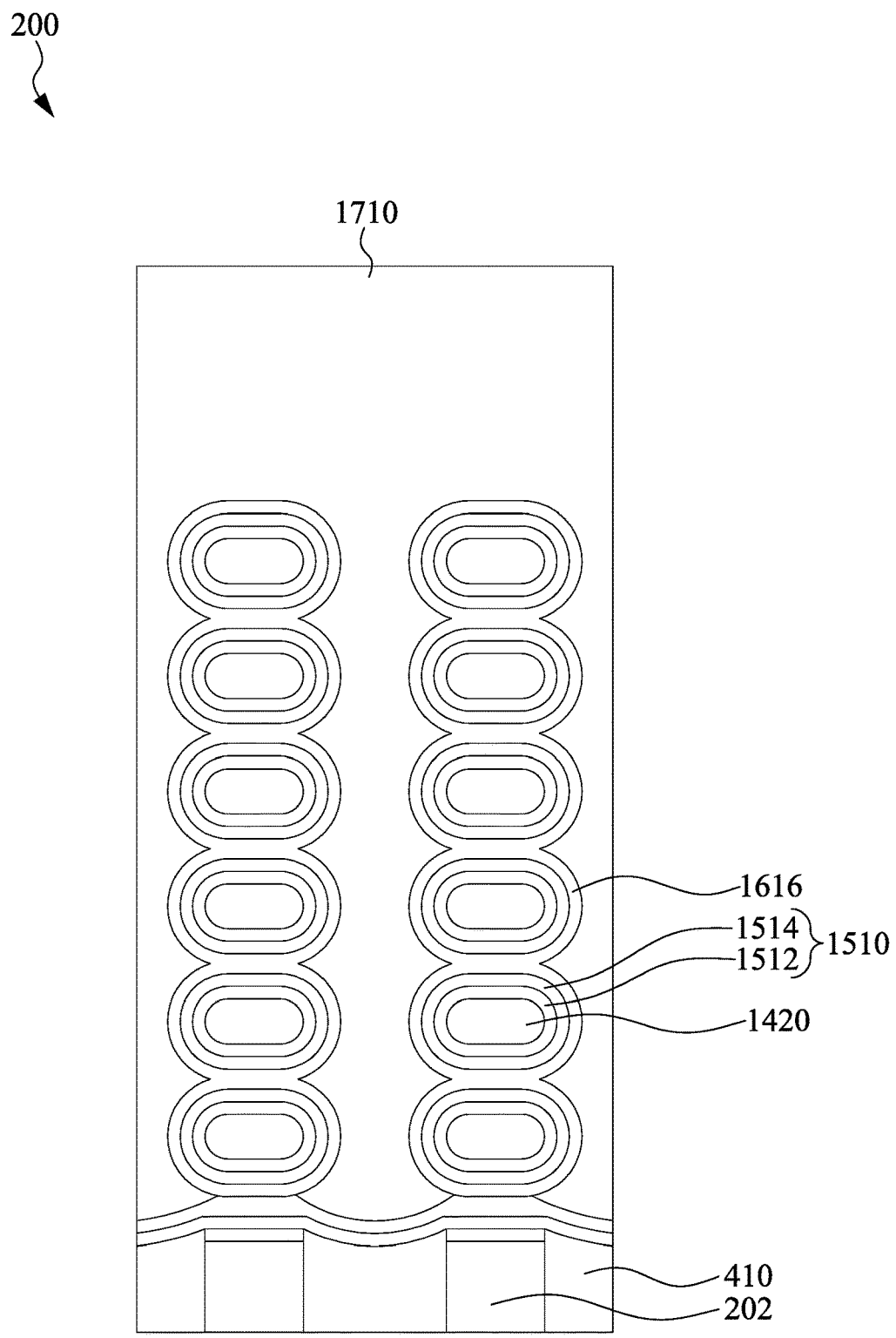
Figure 17D:
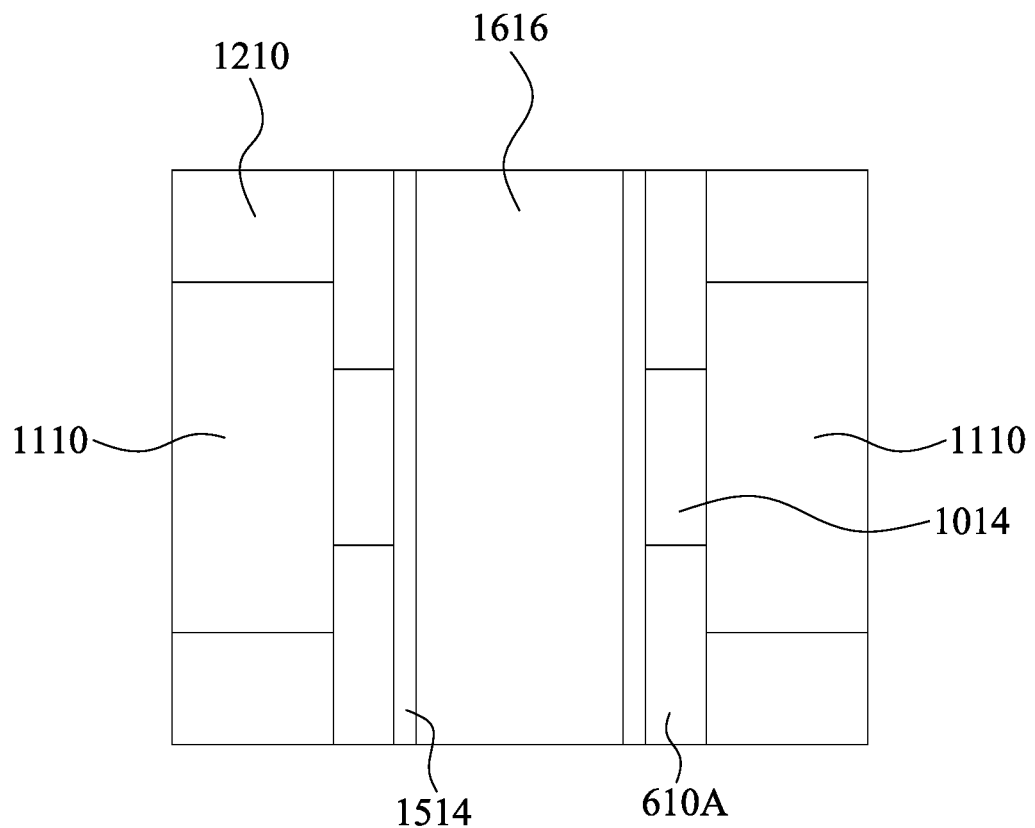
FIGS. 17D and 17E illustrate cross-sectional views of a semiconductor structure taken along line D-D and line E-E, respectively, of FIG. 17B in accordance with some embodiments of the present disclosure.
Figure 17E:
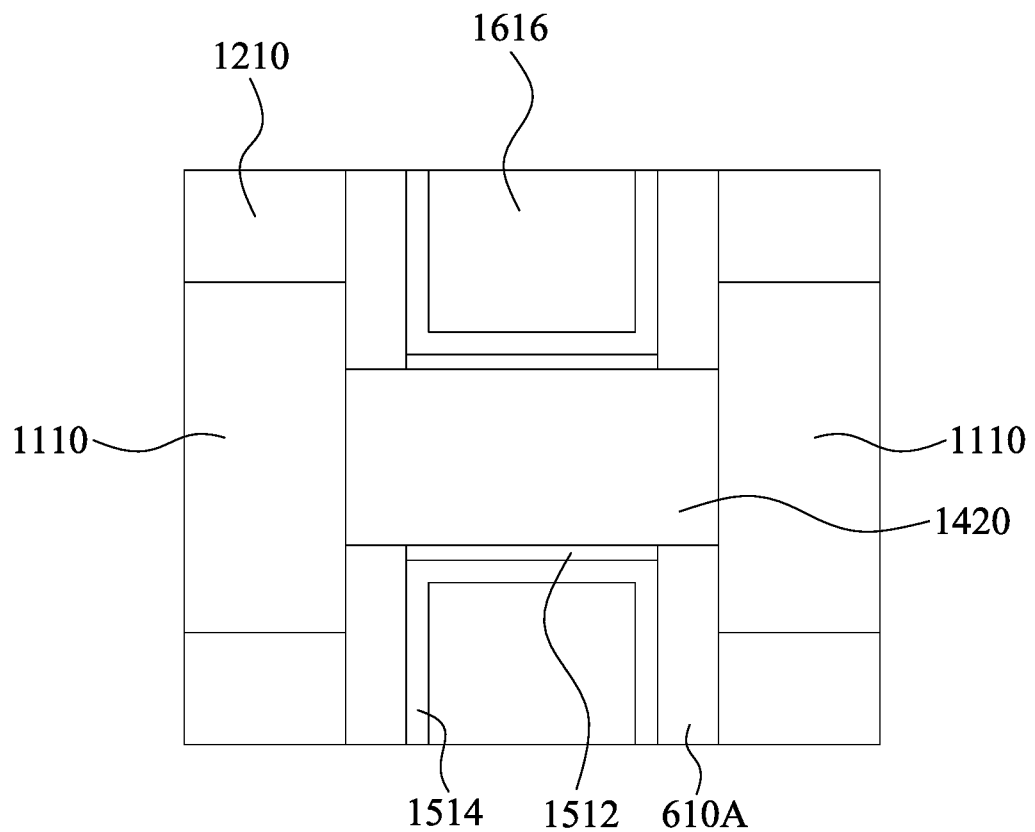

Referring to FIGS. 17A, 17B, 17C, 17D and 17E, a filling metal layer 1710 of the metal gate is formed. FIG. 17B illustrates the channel length cross-section corresponding to FIG. 17A along line B-B. FIG. 17C illustrates the channel width cross-section corresponding to FIG. 17A along line C-C. FIGS. 17D and 17E illustrate cross-sectional views of the semiconductor structure 200 taken along line D-D and line E-E, respectively, of FIG. 17B. The cross section of FIG. 17D shows a top view of a plane in the final gate structure 1400 through the WFA layer 1616 between adjacent channel structures 1420, while The cross section of FIG. 17E is a top view of a plane in the final gate structure 1400 through the channel structure 1420. The filling metal layer 1710 is disposed on the WFA layer 1616. In some embodiments, the filling metal layer 1710 covers the WFA layer 1616, as shown in FIGS. 17A and 17C. In some embodiments, due to the oxidation of the WFA layer 1616 as described above, an oxide layer, such as a silicon oxide layer, is at an interface between the WFA layer 1616 and the filling metal layer 1710. In some embodiments, after the forming of the filling metal layer 1710, the filling metal layer 1710 fills the gate trench 1320. In various embodiments, the filling metal layer 1710 may be formed by ALD, PVD, CVD, e-beam evaporation, or other suitable process. In some embodiments, the filling metal layer 1710 may include a multi-layer structure, such as various combinations of a liner layer, a wetting layer, an adhesion layer, a barrier layer, a block layer, a capping layer, or the like. By way of example, the filling metal layer 1710 may include Ti, Ag, Al, TiAl, TiAlN, Ta, TaN, TaC, TaCN, TaSiN, Mn, Zr, TiN, TaN, Ru, Mo, WN, Cu, W, Re, Ir, Co, Ni, other suitable metal materials or a combination thereof. In some embodiments, the filling metal layer 1710 includes a tungsten-based material formed from precursors, for example, $WF_6+H_2$ or $WF_6+B_2H_6$ or $WF_6+SiH_4$ or $WF_6+Si_2H_6$. In some embodiments, the filling metal layer 1710 includes a TiN layer formed from precursors, e.g., $TiCl_4+NH_3$.

Referring to FIG. 17E, the channel structure 1420 is formed between the opposite S/D features 1110. Referring to FIG. 17D, as described above, in some examples, the inner spacers 1014 fill the spaces in the gate trench 1320 between the adjacent channel structures 1420 and serve as etch stop layers to protect the S/D features 1110 during removal of the second portions 214B of the first epitaxial layers 214 in the gate trench 1320. As a result, during the forming of the final gate structure 1400, the gate dielectric layer 1510 covers the inner spacers 1014.

Figure 18:
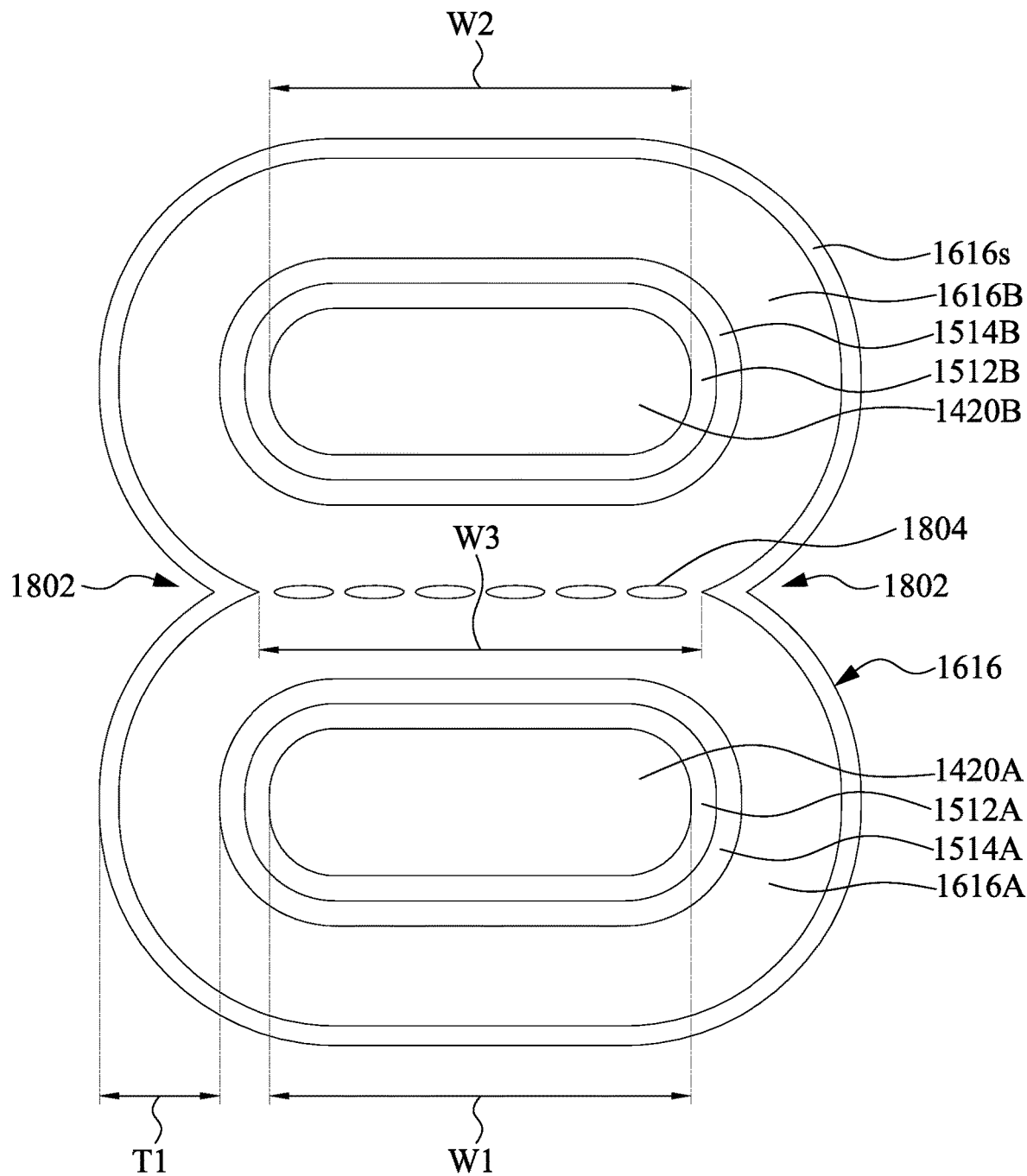
FIG. 18 illustrates a magnified cross-sectional view of a portion of the semiconductor structure illustrated in FIG. 17C in accordance with some embodiments of the present disclosure.

FIG. 18 illustrates a magnified cross-sectional view of a portion of the semiconductor structure 200 illustrated in FIG. 17C in accordance with some embodiments of the present disclosure. The portion of the semiconductor structure 200 includes a first channel structure 1420A, a first high-k dielectric layer 1514A surrounding the first channel structure 1420A. The portion of the semiconductor structure 200 also includes a second channel structure 1420B substantially parallel to the first channel structure 1420A, a second high-k dielectric layer 1514B surrounding the second channel structure 1420B. In some embodiments, the first channel structure 1420A is disposed above the semiconductor substrate 202 as described above, and the second channel structure 1420A is disposed above and substantially parallel to the first channel structure 1420A. The portion of the semiconductor structure 200 further includes a WFA layer 1616 on the first high-k dielectric layer 1514A and the second high-k dielectric layer 1514B. The WFA layer 1616 contains silicon element. A portion of the WFA layer 1616 is disposed between the first high-k dielectric layer 1514A and the second high-k dielectric layer 1514B. In some embodiments, the WFA layer 1616 is in physical contact with the first high-k dielectric layer 1514A and the second high-k dielectric layer 1514B. In some embodiments, the WFA layer 1616 is in direct contact with the first high-k dielectric layer 1514A and the second high-k dielectric layer 1514B. In some embodiments, the WFA layer 1616 includes a first portion 1616A around the first high-k dielectric layer 1514A and a second portion 1616B around the second high-k dielectric layer 1514B. In some embodiments, the first portion 1616A of the WFA layer 1616 merges second portion 1616B of the WFA layer 1616 between the first high-k dielectric layer 1514A and the second high-k dielectric layer 1514B. In some embodiments, a distance between the first high-k dielectric layer 1414A and the second high-k dielectric layer 1414B is defined by the WFA layer 1616. In some embodiments, the portion of the semiconductor structure 200 includes a first interfacial layer 1512A between the first channel structure 1420A and the first high-k dielectric layer 1514A, and a second interfacial layer 1512B between the second channel structure 1420B and the second high-k dielectric layer 1514B.

In some embodiments, the first portion 1616A of the WFA layer 1616 is in direct contact with the second portion 1616B of the WFA layer 1616. In some embodiments, the first portion 1616A of the WFA layer 1616 is in direct contact with the second portion 1616B of the WFA layer 1616 so that the WFA layer 1616 has an hourglass shape between the channel structures 1420A and 1420B, in which a neck 1802 of the hourglass shape has a minimal width W3 between the first high-k dielectric layer 1514A and the second high-k dielectric layer 1514B. In some embodiments, in a cross-section perpendicular to a top surface of the substrate 202 and perpendicular to a lengthwise direction of channel structures (i.e., a channel width cross-section as shown in FIG. 18), a width W3 of the neck 1802 is larger than a width W1 of the first channel structure 1420A and a width W2 of the second nanosheet structure 1420B. In some embodiments, an interface 1804 is formed between the first portion 1616A of the WFA layer 1616 and the second portion 1616B of the WFA layer 1616. In some embodiments, the interface 1804 includes a seam or a void. The seam or void may be vacuum due to the forming of the first WFA portion 1616A and the second portion 1616B under a substantially vacuum condition. In some embodiments, the first portion 1616A of the WFA layer 1616 and the second portion 1616B of the WFA layer 1616 are respectively a single-material or a uniformly formed layer comprising silicon element as shown in FIG. 18. In some embodiments, the first portion 1616A of the WFA layer 1616 and the second portion 1616B of the WFA layer 1616 are respectively a single layer of pure silicon. In some embodiments, due to the oxidation of the WFA layer 1616 as described above, an oxide layer 1616s, such as a silicon oxide layer, is formed around the WFA layer 1616.

In some embodiments, a thickness T1 of the WFA layer 1616 is relatively small, e.g., less than about 15 Angstrom and the final gate structure 1400 with the WFA layer 1616 can still achieve a desired band-edge work function (e.g., about 4.2 eV) since the WFA layer 1616 contains silicon.

Figure 19:
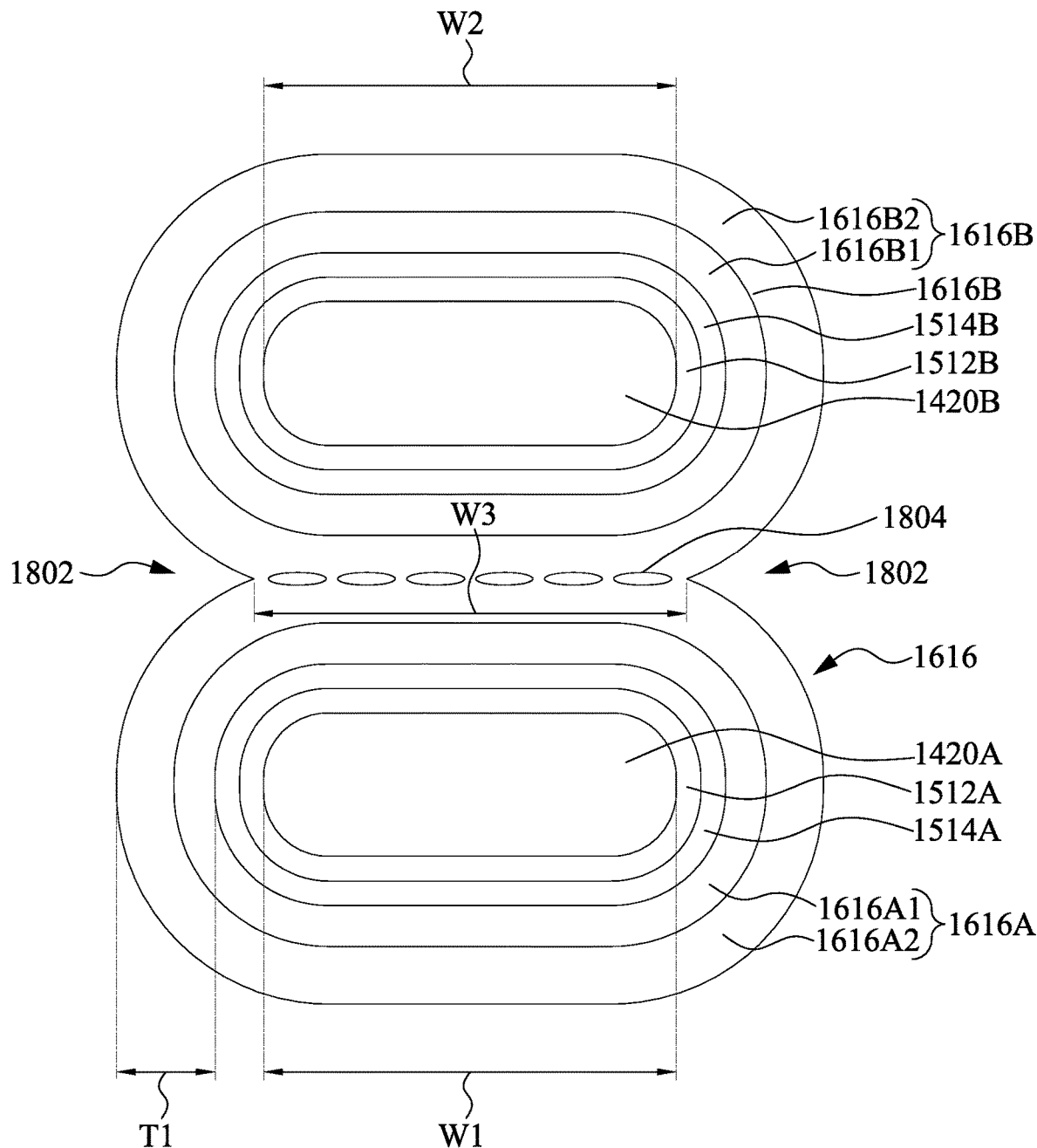
FIG. 19 illustrates a magnified cross-sectional view of a portion of the semiconductor structure illustrated in FIG. 17C in accordance with some embodiments of the present disclosure.

FIG. 19 illustrates a magnified cross-sectional view of a portion of the semiconductor structure 200 illustrated in FIG. 17C in accordance with some embodiments of the present disclosure. The portion of the semiconductor structure illustrated in FIG. 19 is similar to the semiconductor structure illustrated in FIG. 18, except that the first portion 1616A and the second portion 1616B of the WFA layer 1616 respectively have a double-layer structure. In some embodiments, the first portion 1616A of the WFA layer 1616 includes an inner sub-WFA layer 1616A1 around the first high-k dielectric layer 1514A and an outer sub-WFA layer 1616A2 around the inner sub-WFA layer 1616A1. In some embodiments, the inner sub-WFA layer 1616A1 is a single layer of pure silicon and the outer sub-WFA layer 1616A is a single layer of transition metal silicide as described above. Similarly, in some embodiments, the second portion 1616B of the WFA layer 1616 includes an inner sub-WFA layer 1616B1 around the second high-k dielectric layer 1514B and an outer sub-WFA layer 1616B2 around the inner sub-WFA layer 1616B1. In some embodiments, the inner sub-WFA layer 1616B1 is a single layer of pure silicon and the outer sub-WFA layer 1616B is a single layer of transition metal silicide as described above. In some embodiments, the WFA layer 1616 has a triple-layer structure including an inner sub-WFA layer (such as the inner sub-WFA layer 1616A1 and the inner sub-WFA layer 1616B1), an outer sub-WFA layer (such as the outer sub-WFA layer 1616A2 and the inner sub-WFA layer 1616B2) around the inner sub-WFA layer, and an outermost sub-WFA layer (such as the oxide layer 1616s as shown in FIG. 18) around the outer sub-WFA layer. In some examples, the triple-layer structure of the WFA layer 1616 includes a pure silicon layer, a transition metal silicide layer around the pure silicon layer, and an oxide layer, such as a silicon oxide layer, around the transition metal silicide layer.

In some embodiments, an interface 1804 is formed between the outer sub-WFA layer 1616A2 and the outer sub-WFA layer 1616B2. In some embodiments, the interface 1804 includes a seam or a void. The seam or void may be vacuum due to the forming of the outer sub-WFA layer 1616A2 and the outer sub-WFA layer 1616B2 in a substantially vacuum condition.

According to some aspects of the present disclosure, in some embodiments, a semiconductor structure includes a first gate structure around a first set of channel structures and a second gate structure around a second set of channel structures. In some embodiments, the first gate structure and the second gate structure are respectively as described and illustrated with respect to the final gate structure 1400 described above. In some embodiments, the first set of channel structures and the second set of channel structures are respectively as described and illustrated with respect to the channel structures 1420 described above. The first gate structure includes a first WFA layer, and the second gate structure includes a second WFA layer. In some embodiments, the first WFA layer and the second WFA layer are respectively differently arranged as described and illustrated with respect to the WFA layer 1616 described above with reference to FIG. 18. In some embodiment, the first WFA layer includes pure silicon as described with reference to FIG. 18, and the second WFA layer includes transition metal silicide as described with reference to FIG. 18, where the pure silicon material of the WFA layer in the second gate structure is replaced by a transition metal silicide layer. A work function achieved by the first gate structure is lower than a work function achieved by the second gate structure. In some embodiments, the first gate structure can achieve a work function of around 4.2 eV, and the second gate structure can achieve a work function of around 4.3 eV. Therefore, the semiconductor structure allows for multiple threshold voltages (Vt). Alternatively, the first WFA layer includes pure silicon or metal silicide layer as described with reference to FIG. 18, and the second WFA layer includes a double-layer structure as described with reference to FIG. 19.

The present disclosure provides a semiconductor structure and a method for forming the semiconductor structure in accordance with some embodiments. The semiconductor structure includes a first nanosheet channel structure and a first high-k (HK) dielectric layer around the first nanosheet channel structure. In addition, the semiconductor structure includes a second nanosheet channel structure disposed above the first nanosheet channel structure and a second high-k (HK) dielectric layer around the second nanosheet channel structure. The semiconductor structure further includes a Si-containing WFA layer between the first high-k dielectric layer and the second high-k dielectric layer. As a result, the semiconductor structure includes a "HK-Si-HK" structure between the first nanosheet channel structure and the second nanosheet channel structure. The WFA layer contains Si element, instead of Al element, and therefore can have a relatively small thickness (e.g., approximately 15 Angstrom or less) to achieve the desired band-edge work function (e.g., approximately 4.2 eV). Accordingly, the semiconductor structure in accordance with the present disclosure can be down-scaled and is suitable for use in advanced technology nodes.

In some embodiments, a semiconductor structure is provided. The semiconductor structure includes a first nanosheet channel structure, a first high-k dielectric layer surrounding the first nanosheet channel structure, a second nanosheet channel structure disposed above and substantially parallel to the first nanosheet channel structure, a second high-k dielectric layer surrounding the second nanosheet channel structure, and a work function adjustment layer including silicon and disposed between the first high-k dielectric layer and the second high-k dielectric layer. The first high-k dielectric layer and the second high-k dielectric layer are separated by the work function adjustment layer.

In some embodiments, a semiconductor structure is provided. The semiconductor structure includes a first nanosheet channel structure, and a first high-k dielectric layer surrounding the first nanosheet channel structure. In addition, the semiconductor structure includes a second nanosheet channel structure disposed above and substantially parallel to the first nanosheet channel structure, and a second high-k dielectric layer surrounding the second nanosheet channel structure. The semiconductor structure further includes a work function adjustment layer surrounding the first high-k dielectric layer and the second high-k dielectric layer. The work function adjustment layer includes an hourglass shape between the first high-k dielectric layer and the second high-k dielectric layer.

In some embodiments, a method for forming a semiconductor structure is provided. The method includes the following operations. A first nanosheet channel structure and a second nanosheet channel structure are formed. The second nanosheet channel structure is substantially parallel to the first nanosheet channel structure. A first high-k dielectric layer is formed all around the first nanosheet channel structure, and a second high-k dielectric layer is formed all around the second nanosheet channel structure. A silicon-based precursor is introduced to form a silicon-containing work function adjustment layer between the first high-k dielectric layer and the second high-k dielectric layer. A filling metal layer is formed to surround the first nanosheet channel structure, the second nanosheet channel structure, the first high-k dielectric layer, the second high-k dielectric layer and the silicon-containing work function adjustment layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first nanosheet channel structure;
a first high-k dielectric layer surrounding the first nanosheet channel structure;
a second nanosheet channel structure disposed above and substantially parallel to the first nanosheet channel structure;
a second high-k dielectric layer surrounding the second nanosheet channel structure;
a work function adjustment layer comprising silicon and disposed between the first high-k dielectric layer and the second high-k dielectric layer, wherein the work function adjustment layer comprises an elementary silicon portion in direct contact with the first and second high-k dielectric layers, and a silicon oxide coating in direct contact with the elementary silicon portion, wherein silicon elements of the silicon oxide coating are provided by the elementary silicon portion;
a metal layer in direct contact with the silicon oxide coating; and
a void disposed in the work function adjustment layer and between the first nanosheet channel structure and the second nanosheet channel structure,
wherein the first high-k dielectric layer and the second high-k dielectric layer are separated by the work function adjustment layer, and the work function adjustment layer is substantially free of metal.

2. The semiconductor structure of claim 1, wherein the work function adjustment layer comprises a first portion surrounding the first high-k dielectric layer and a second portion surrounding the second high-k dielectric layer.

3. The semiconductor structure of claim 2, wherein the first portion of the work function adjustment layer merges the second portion of the work function adjustment layer between the first high-k dielectric layer and the second high-k dielectric layer.

4. The semiconductor structure of claim 1, wherein the silicon oxide coating is a native oxide layer on a surface of the elementary silicon portion.

5. The semiconductor structure of claim 1, wherein the work function adjustment layer has a thickness of no more than 15 angstrom.

6. The semiconductor structure of claim 1, further comprising:
a first interfacial layer between the first nanosheet channel structure and the first high-k dielectric layer, and a second interfacial layer between the second nanosheet channel structure and the second high-k dielectric layer; and
two spacer elements in contact with sidewalls of the first and second high-k dielectric layers and sidewalls of the first and second interfacial layers from a top-view perspective.

7. A semiconductor structure, comprising:
a first nanosheet channel structure;
a first high-k dielectric layer surrounding the first nanosheet channel structure;
a second nanosheet channel structure disposed above and substantially parallel to the first nanosheet channel structure;
a second high-k dielectric layer surrounding the second nanosheet channel structure;
a work function adjustment layer comprising silicon and disposed around the first high-k dielectric layer and the second high-k dielectric layer, wherein the work function adjustment layer comprises an elementary silicon portion in direct contact with the first and second high-k dielectric layers, and a silicon oxide coating in direct contact with the elementary silicon portion, wherein silicon elements of the silicon oxide coating are provided by the elementary silicon portion;
a metal layer in direct contact with the silicon oxide coating; and
a void disposed in the work function adjustment layer and between the first nanosheet channel structure and the second nanosheet channel structure,
wherein a portion of the work function adjustment layer is sandwiched between the first high-k dielectric layer and the second high-k dielectric layer, and the work function adjustment layer is substantially free of metal.

8. The semiconductor structure of claim 7, further comprising a first interfacial layer between the first nanosheet channel structure and the first high-k dielectric layer, and a second interfacial layer between the second nanosheet channel structure and the second high-k dielectric layer.

9. A semiconductor structure, comprising:
a first nanosheet channel structure;
a first high-k dielectric layer surrounding the first nanosheet channel structure;
a second nanosheet channel structure disposed above and substantially parallel to the first nanosheet channel structure;
a second high-k dielectric layer surrounding the second nanosheet channel structure;
a work function adjustment layer disposed around the first high-k dielectric layer and the second high-k dielectric layer, wherein the work function adjustment layer comprises an elementary silicon portion in direct contact with the first and second high-k dielectric layers and a silicon oxide coating in direct contact with the elementary silicon portion, wherein silicon elements of the silicon oxide coating are provided by the elementary silicon portion;
a metal layer in direct contact with the silicon oxide coating; and
a void disposed in the work function adjustment layer and between the first nanosheet channel structure and the second nanosheet channel structure,
wherein a portion of the work function adjustment layer extends from the first high-k dielectric layer to the second high-k dielectric layer, and the work function adjustment layer is substantially free of metal.

10. The semiconductor structure of claim 9, further comprising a first interfacial layer between the first nanosheet channel structure and the first high-k dielectric layer, and a second interfacial layer between the second nanosheet channel structure and the second high-k dielectric layer.

11. The semiconductor structure of claim 1, wherein from a top-view perspective, the first or second high-k dielectric layer includes a first portion and a second portion arranged on two sides of the work function adjustment layer, wherein each of the first portion and the second portion is between the work function adjustment layer and an inner spacer.

12. The semiconductor structure of claim 1, wherein the first nanosheet channel structure and the second nanosheet channel structure have a rounded rectangular shape.

13. The semiconductor structure of claim 3, wherein the void is disposed at an interface between the first portion of the work function adjustment layer and the second portion of the work function adjustment layer.

14. The semiconductor structure of claim 7, wherein the silicon oxide coating is substantially free of metal.

15. The semiconductor structure of claim 7, wherein the first channel structure and the second channel structure have an oval shape.

16. The semiconductor structure of claim 9, further comprising a plurality of inner spacers having a rectangular shape and disposed on outer sides of the first and second high-k dielectric layers from a top-view perspective.

17. The semiconductor structure of claim 9, wherein the first nanosheet channel structure and the second nanosheet channel structure have a rounded rectangular shape.

18. The semiconductor structure of claim 13, wherein the void is vacuumed.

19. The semiconductor structure of claim 1, further comprising:
- a first dielectric layer laterally surrounding a first end of the first and second nanosheet channel structures;
- a second dielectric layer laterally surrounding a second end of the first and second nanosheet channel structures;
- a first spacer element covering the first dielectric layer, wherein the first dielectric layer and the first spacer element substantially have substantially identical widths from a top-view perspective; and
- a second spacer element covering the second dielectric layer, wherein the second dielectric layer and the second spacer element substantially have substantially identical widths from a top-view perspective.

20. The semiconductor structure of claim 19, further comprises:
- a fin element protruding from a substrate, wherein the first nanosheet channel structure and the second nanosheet channel structure are disposed above the fin element;
- a plurality of isolation structures disposed on opposite sides of the fin;
- source and drain features, wherein the first and second nanosheet channel structures extending between the source and drain features;
- a plurality of first inner spacers each in contact with the source feature and one of the first and second high-k dielectric layers from a top-view perspective;
- a plurality of second inner spacers each in contact with the drain feature and one of the first and second high-k dielectric layers from a top-view perspective; and
- an inter-layer dielectric layer surrounding the source and drain features,
- wherein the first spacer element separates the source feature from each of the first and second high-k dielectric layers, and separates the inter-layer dielectric layer from each of the first and second high-k dielectric layers; and
- wherein the second spacer element separates the drain feature and each of the first and second high-k dielectric layers, and separates the inter-layer dielectric layer and each of the first and second high-k dielectric layers.

* * * * *